United States Patent
Hayashi et al.

(10) Patent No.: US 9,431,543 B2
(45) Date of Patent: Aug. 30, 2016

(54) THIN-FILM SEMICONDUCTOR DEVICE FOR DISPLAY APPARATUS AND METHOD OF MANUFACTURING SAME

(71) Applicants: JOLED INC., Tokyo (JP); PANASONIC LIQUID CRYSTAL DISPLAY CO., LTD., Hyogo (JP)

(72) Inventors: Hiroshi Hayashi, Hyogo (JP); Takahiro Kawashima, Osaka (JP); Genshirou Kawachi, Chiba (JP)

(73) Assignees: JOLED INC., Tokyo (JP); PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 590 days.

(21) Appl. No.: 13/776,783

(22) Filed: Feb. 26, 2013

(65) Prior Publication Data
US 2013/0168678 A1    Jul. 4, 2013

Related U.S. Application Data

(63) Continuation of application No. PCT/JP2011/002037, filed on Apr. 6, 2011.

(51) Int. Cl.
H01L 29/66    (2006.01)
H01L 29/78    (2006.01)
H01L 29/786    (2006.01)

(52) U.S. Cl.
CPC ... *H01L 29/78669* (2013.01); *H01L 29/66765* (2013.01); *H01L 29/78606* (2013.01); *H01L 29/78678* (2013.01)

(58) Field of Classification Search
CPC .......................... H01L 29/6675; H01L 21/026
USPC ....... 257/57, 59, E21.412, E29.273; 438/158
See application file for complete search history.

(56) References Cited

U.S. PATENT DOCUMENTS 5,989,945 A    11/1999    Yudasaka et al.
6,593,591 B2    7/2003    Yudasaka et al.
(Continued)

FOREIGN PATENT DOCUMENTS

CN    1782878    6/2006
JP    02-118954    9/1990
(Continued)

OTHER PUBLICATIONS

Toshiaki Arai et al., "41.2: Micro Silicon Technology for Active Matrix OLED Display", SID Symposium Digest of Technical Papers, vol. 38, No. 1, May 2007, pp. 1370-1373.
(Continued)

*Primary Examiner* — Ori Nadav
*Assistant Examiner* — Vernon P Webb
(74) *Attorney, Agent, or Firm* — Greenblum & Bernstein, P.L.C.

(57) ABSTRACT

A thin-film semiconductor device includes: a substrate; a gate electrode above the substrate; a gate insulation film above the gate electrode; a channel layer above the gate insulation film, the channel layer having a raised part; a channel protection layer over the raised part of the channel layer, the channel protection layer comprising an organic material, and the organic material including silicon, oxygen, and carbon; an interface layer at an interface between a top surface of the raised part of the channel layer and the channel protection layer, and comprises at least carbon and silicon that derive from the organic material; and a source electrode and a drain electrode each provided over a top surface and a side surface the channel protection layer, a side surface of the interface layer, a side surface of the raised part of the channel layer, and a top surface of the channel layer.

12 Claims, 19 Drawing Sheets

(56) References Cited

U.S. PATENT DOCUMENTS

| | | |
|---|---|---|
| 6,794,682 B2 | 9/2004 | Watanabe et al. |
| 7,067,337 B2 | 6/2006 | Yudasaka et al. |
| 7,229,859 B2 | 6/2007 | Yudasaka et al. |
| 7,374,856 B2 | 5/2008 | Suwa et al. |
| 8,304,160 B2 | 11/2012 | Minegishi et al. |
| 8,330,166 B2 | 12/2012 | Hayashi et al. |
| 2002/0074547 A1 | 6/2002 | Yudasaka et al. |
| 2002/0100908 A1 | 8/2002 | Yudasaka et al. |
| 2002/0146871 A1 | 10/2002 | Watanabe et al. |
| 2002/0179906 A1 | 12/2002 | Yudasaka et al. |
| 2003/0134519 A1 | 7/2003 | Yudasaka et al. |
| 2006/0115766 A1 | 6/2006 | Suwa et al. |
| 2006/0289859 A1* | 12/2006 | Yoneya ............... H01L 51/0012 257/40 |
| 2010/0260983 A1 | 10/2010 | Minegishi et al. |
| 2011/0278583 A1* | 11/2011 | Hayashi ............... H01L 29/04 257/72 |
| 2013/0105797 A1* | 5/2013 | Hayashi ............ H01L 29/66765 257/57 |

FOREIGN PATENT DOCUMENTS

| | | |
|---|---|---|
| JP | 08-055993 | 2/1996 |
| JP | 2000-232092 | 8/2000 |
| JP | 2002-107928 | 4/2002 |
| JP | 2002-139838 | 5/2002 |
| JP | 2002-368229 | 12/2002 |
| JP | 3725169 | 9/2005 |
| JP | 2006-156601 | 6/2006 |
| JP | 2010-266843 | 11/2010 |
| JP | 2011-053366 | 3/2011 |

OTHER PUBLICATIONS

U.S. Appl. No. 13/772,723 to Hiroshi Hayashi et al., which was filed Feb. 21, 2013.

Office Action issued in China Counterpart Patent Appl. No. 201180041844.5, dated Nov. 4, 2015, along with an English translation thereof.

* cited by examiner (Y: Amino Group, Epoxy Group, Methacryl Group, Vinyl Group, Mercapto Group, etc.)

THIN-FILM SEMICONDUCTOR DEVICE FOR DISPLAY APPARATUS AND METHOD OF MANUFACTURING SAME

CROSS REFERENCE TO RELATED APPLICATION

This is a continuation application of PCT Patent Application No. PCT/JP2011/002037 filed on Apr. 6, 2011, designating the United States of America. The entire disclosure of the above-identified application, including the specification, drawings and claims are incorporated herein by reference in its entirety.

FIELD

One or more exemplary embodiments disclosed herein relate generally to thin-film semiconductor devices for display apparatuses and methods of manufacturing the same, and more particularly to a channel-protection thin-film semiconductor device for display apparatus and a method of manufacturing the same.

BACKGROUND

In recent years, organic Electroluminescence (EL) displays including EL comprising an organic material have been attracting attention as a type of next-generation flat-panel displays succeeding liquid crystal displays. In display devices using active matrix method, such as organic EL displays, thin-film semiconductor devices for display apparatuses which are called thin-film transistors (TFT) (hereinafter, referred to also simply as "thin-film semiconductor devices") are used.

In particular, unlike voltage-driven liquid crystal displays, the organic EL displays are current-driven display devices. Accordingly, there is an urgent need for development of thin-film semiconductor devices having excellent turn-On/turn-Off characteristics as driving circuits for the display devices using active matrix method.

Moreover, display devices are demanded to increase a screen size and reduce a cost. For thin-film semiconductor devices, bottom-gate thin-film semiconductor devices are generally used, because they have a gate electrode closer to a substrate than a channel layer is, which reduces cost.

The bottom-gate thin-film semiconductor devices are classified into two major categories: channel-etching thin-film semiconductor devices in which a channel layer serving as a current flowing path is etched, and channel-protection (etching-stopper) thin-film semiconductor devices in which a channel layer is prevented from being etched.

In comparison to the channel-protection thin-film semiconductor devices, the channel-etching thin-film semiconductor devices can decrease steps of photolithography, thereby reducing a manufacturing cost.

On the other hand, the channel-protection thin-film semiconductor devices can prevent the channel layer from being damaged by etching, thereby suppressing the increase of characteristic variations on the surface of the substrate. Moreover, a channel layer of the channel-protection thin-film semiconductor devices can be manufactured to be thinner than that of the channel-etching thin-film semiconductor devices. As a result, the channel-protection thin-film semiconductor devices can reduce parasitic resistance components to improve the turn-On characteristics. The channel-protection thin-film semiconductor devices are therefore advantageous for high resolution.

Therefore, the channel-protection thin-film semiconductor devices are suitable as, for example, thin-film semiconductor devices in current-driven organic EL display devices having organic EL elements. Even if a manufacturing cost of the channel-protection thin-film semiconductor devices is higher than that of the channel-etching thin-film semiconductor devices, channel-protection thin-film semiconductor devices have been attempted to be applied to pixel circuits in organic EL display devices (for example, Non-Patent Literature 1).

Furthermore, as a channel-protection thin-film semiconductor device providing excellent turn-On characteristics, a thin-film semiconductor device including a channel layer having a raised part is disclosed (for example, Patent Literature 1). According to the technique disclosed in Patent Literature 1, non-raised parts on both sides of the raised part of the channel layer serving as a current flowing path is thinner than the raised part that is a higher part of the channel layer. Therefore, when a current flows between a source electrode and a drain electrode through the non-raised parts on the both sides of the raised part of the channel layer, resistance components can be reduced in a vertical direction in the channel layer. It is therefore possible to suppress crossing resistance through the non-raised parts on both sides of the raised part of the channel layer, thereby increasing ON-current. Furthermore, the upper portion of the raised part of the channel layer serves as a resistance between the source electrode and the drain electrode. Thereby, move of electric charges through a back channel between the source electrode and the drain electrode is suppressed.

In contrast, as a channel-protection thin-film semiconductor device achieving cost reduction, a thin-film semiconductor device having a channel protection layer that is a coated insulation film is disclosed (for example, Patent Literature 2). Patent Literature 2 discloses a method of forming a function layer included in the thin-film semiconductor device, by coating a liquid including desired material by a wet process. Therefore, it is possible to reduce a manufacturing cost of the display device and increase a throughput, in comparison to the conventional method of forming a function layer by a process in vacuum, such as Chemical Vapor Deposition (CVD) or spattering.

CITATION LIST

Patent Literatures

[Patent Literature 1] U.S. Pat. No. 6,794,682, Specification
[Patent Literature 2] Japanese Patent No. 3725169

Non Patent Literature

[Non-Patent Literature 1] T. Arai et al., SID 07 Digest, (2007) p 1370.

SUMMARY

Technical Problem

In the conventional techniques, however, there is a difficulty in providing channel-protection thin-film semiconductor devices including coated channel protection layers at lower manufacturing cost with excellent turn-On/turn-Off characteristics.

In order to address the above problem, one non-limiting and exemplary embodiment provides a channel-protection thin-film semiconductor device and a method of manufacturing the thin-film semiconductor device which are capable of improving turn-On/turn-Off characteristics.

Solution to Problem

In one general aspect, the techniques disclosed here feature a thin-film semiconductor device comprising: a substrate; a gate electrode above the substrate; a gate insulation film above the gate electrode; a channel layer above the gate insulation film, the channel layer having a raised part; a channel protection layer over the raised part of the channel layer, the channel protection layer comprising an organic material including a surface active agent and a photosensitizing agent, and the organic material including silicon, oxygen, and carbon; an interface layer at an interface between a top surface of the raised part of the channel layer and the channel protection layer, the channel protection layer comprising at least carbon and silicon which derive from the organic material, and the carbon having a higher concentration than a concentration of carbon in the channel protection layer; and a source electrode and a drain electrode each of which is provided over (a) a top surface and a side surface of a corresponding one of ends of the channel protection layer, (b) a side surface of the interface layer which continues into the side surface of the channel protection layer, (c) a side surface of the raised part of the channel layer which continues into the side surface of the interface layer, and (d) a top surface of the channel layer which continues into the side surface of the raised part of the channel layer, wherein the concentration of the carbon included in the interface layer is at least fifty times as much as a concentration of carbon included as impurity in the channel layer.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The thin-film semiconductor device for display apparatus according to one or more exemplary embodiments or features disclosed herein can improve On-current while an Off-current is reduced exceeding a limit of a layer as a resistance.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT(S)

Figure 1:
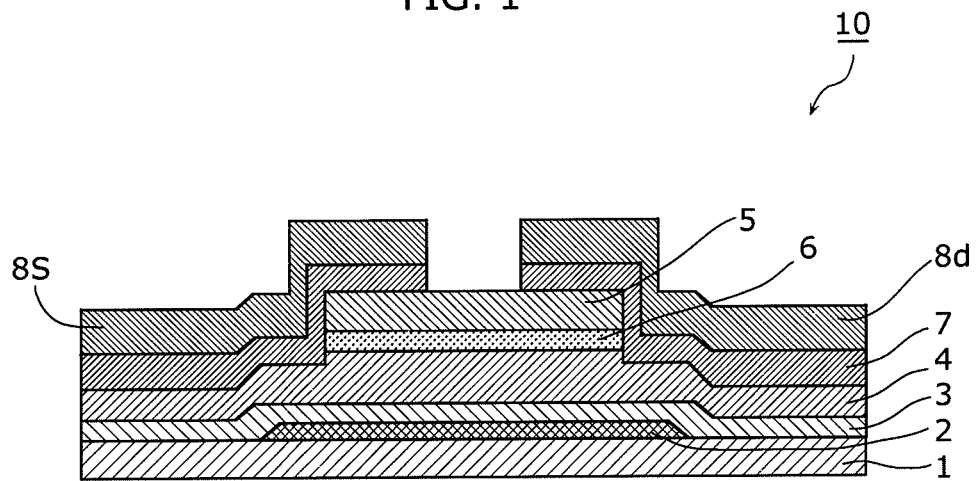
FIG. 1 is a cross-sectional view schematically illustrating a structure of a display thin-film semiconductor device 10 for display apparatus according to Embodiment 1.

In the above-described technique disclosed in Patent Literature 1, move of electric charges are suppressed only by using an upper portion of a raised part of the channel layer as a resistance. Therefore, move of electric charges are suppressed in a back channel between a source electrode and a drain electrode only in a range where the upper portion can suppress the move of electric charges as a resistance.

More specifically, if inorganic material such as an oxide silicon film, for example, is deposited by CVD or spattering to form a channel protection layer and wet etching or dry etching is performed on the channel protection layer to have a desired pattern, the channel protection layer includes positive fixed charges. Therefore, the fixed charges cause a very small voltage (Vf) to be applied to a channel layer positioned below the channel protection layer (at and close to the interface between the channel protection layer and the channel layer). In this case, when the voltage (Vf) caused by the fixed charges is higher than a threshold voltage (Vbc) of the back channel of the channel layer, in turning Off the TFT, a parasitic transistor is operated to cause a leakage current to flow through the back channel of the channel layer, thereby deteriorating turn-Off characteristics.

Therefore, in the technique disclosed in Patent Literature 1, even if the raised part is capable of reducing an Off-current, it is impossible to significantly reduce the Off-current by exceeding a limit as a resistance.

Furthermore, the examination by the inventors of the present disclosure has shown that, as the technique disclosed in Patent Literature 2, if a material including organic material such as Spin On Glass (SOG) is used as a channel protection layer and is formed to have a desired pattern, the organic material in the channel protection layer remains as residues on locations different from the desired pattern.

In this case, the organic material residues function as a parasitic resistance to block mobility of carriers, thereby reducing an On-current. Furthermore, a thickness of the organic material residues is not always homogeneous for respective thin-film semiconductor devices on the substrate. Therefore, variations of turn-On characteristics of the thin-film semiconductor devices are significantly increased. As a result, the channel-protection thin-film semiconductor devices having less characteristic variations are deprived of their merits.

Moreover, the channel protection layer has a large amount of fixed charges deriving from the organic material. Therefore, the fixed charges cause a leakage current to flow through the back channel of the channel layer, thereby deteriorating turn-Off characteristics.

As described above, while the techniques disclosed in Patent Literatures 1 and 2 have the effects of increasing an On-current and decreasing a cost, the techniques also have the adverse effects of increasing an Off-current, and reducing an On-current and increasing characteristics variations.

Therefore, in the conventional techniques, there is a difficulty in providing a channel-protection thin-film semiconductor device including a coated channel protection layer at a lower manufacturing cost with excellent turn-On/turn-Off characteristics.

According to an exemplary embodiment disclosed herein to address the above problems, a thin-film semiconductor device includes: a substrate; a gate electrode above the substrate; a gate insulation film above the gate electrode; a channel layer above the gate insulation film, the channel layer having a raised part; a channel protection layer over the raised part of the channel layer, the channel protection layer comprising an organic material, and the organic material including silicon, oxygen, and carbon; an interface layer at an interface between a top surface of the raised part of the channel layer and the channel protection layer, the interface layer comprising at least carbon and silicon which derive from the organic material; and a source electrode and a drain electrode each of which is provided over (a) a top surface and a side surface of a corresponding one of ends of the channel protection layer, (b) a side surface of the interface layer which continues into the side surface of the channel protection layer, (c) a side surface of the raised part of the channel layer which continues into the side surface of the interface layer, and (d) a top surface of the channel layer which continues into the side surface of the raised part of the channel layer.

With this, the interface layer which comprises carbon as main components is provided between the raised part of the channel layer and the channel protection layer. It is therefore possible to reduce carrier mobility through the back channel of the channel layer, and also reduce fixed charges moving from the channel protection layer to the channel layer. As a result, it is possible to suppress a leakage current during turning Off, thereby improving turn-OFF characteristics.

In addition, the provision of the raised part of the channel layer causes the parts of the channel layer which are located on the both sides of the raised part to be thinner than the raised part. As a result, it is possible to allow the parts of the channel layer under the source electrode and the drain electrode to be thinner. Therefore, it is possible to reduce crossing resistance in a current path (front path) of a current flowing through the parts (in other words, non-raised parts) on the both sides of the raised part of the channel layer from each of the source electrode and the drain electrode. As a result, a turn-On current can be increased.

For example, each of two contact layers is provided on a part of a top surface and a side surface of a corresponding one of the both sides of the channel protection layer, a side surface of the interface layer which continues into the side surface of the channel protection layer, a side surface of the raised part of the channel layer which continues into the side surface of the interface layer, and a part of the top surface of the channel layer which continues into the side surface of the raised part of the channel layer. The source electrode is provided on the one of the two contact layers and the drain electrode is provided on the other one of the tow contact layers.

Furthermore, non-raised parts on both sides of the raised part of the channel layer may serve as a path on which charges move between the source electrode and the channel region of the channel layer and a path on which charges move between the drain electrode and the channel region, respectively.

Still further, a difference between the thickness of the raised part of the channel layer and the thickness of each of the non-raised parts at the both sides of the raised part is desirably 2 nm or more. Still further, the channel protection layer may have a width equal to a width of a top surface of the raised part of the channel layer.

Still further, the concentration of the carbon included in the interface layer is desirably at least fifty times as much as a concentration of carbon included as impurity in the channel layer. Still further, the concentration of the carbon included in the interface layer is desirably $5 \times 10^{20}$ atoms/com$^3$ or more.

With this, it is possible to surely produce effects of reducing the above-described carrier mobility in the interface layer.

Still further, the organic material desirably comprises sulfur.

With this, the sulfur included in the interface layer can further reduce the above-described carrier mobility.

Still further, a concentration of sulfur included in the interface layer is desirably at least one hundred times as much as a concentration of sulfur included as impurity in the channel layer. Still further, the concentration of the sulfur included in the interface layer is desirably $5 \times 10^{19}$ atoms/cm$^3$ or more.

With this, it is possible to surely produce the effects of reducing the above-described carrier mobility in the interface layer.

Still further, the interface layer desirably has a specific resistance of $2 \times 10^6$ ($\Omega \times cm$) or more.

With this, it is possible to increase insulation properties of the interface layer, thereby further reducing the above-described carrier mobility in the interface layer.

Still further, a thickness of the interface layer desirably ranges from 1 nm to 5 nm.

With this, in forming the channel protection layer including carbon as main components, it is possible to cause the interface layer to have a thickness range from 1 nm to 5 nm.

Still further, the channel layer may include: a first channel layer that is a polycrystalline semiconductor layer below the raised part; and a second channel layer that is an amorphous semiconductor layer on the channel layer, the second channel layer having the raised part.

With this, the first channel layer can improve turn-ON characteristics, and the second channel layer can improve turn-OFF characteristics. As a result, it is possible to provide a thin-film semiconductor device for display apparatus which has more excellent turn-On/turn-Off characteristics.

Still further, the polycrystalline semiconductor layer may comprise polycrystalline silicon, and the amorphous semiconductor layer may comprise amorphous silicon. Still further, the polycrystalline semiconductor layer may include a microcrystalline semiconductor layer having an average grain size range from 10 nm to 50 nm.

According to another exemplary embodiment disclosed herein, According to an exemplary embodiment disclosed herein, a method of manufacturing a thin-film semiconductor device, the method including: preparing a substrate; forming a gate electrode above the substrate; forming a gate insulation film above the gate electrode; forming a channel layer above the gate insulation film; forming a channel protection layer by coating an organic material including silicon, oxygen, and carbon on the channel layer; forming an interface layer at an interface between the channel layer and the channel protection layer, by baking the channel protection layer, the channel protection layer comprising, as main component, carbon that derives from the organic material; etching the channel protection layer and the channel layer to leave a channel region of the channel layer by a predetermined etching method, thereby causing the channel layer to have a raised part and leaving residues of the channel protection layer on the raised part; and forming a source electrode and a drain electrode each of which is provided over (a) a top surface and a side surface of a corresponding one of ends of the channel protection layer, (b) a side surface of the interface layer which continues into the side surface of the channel protection layer, (c) a side surface of the raised part of the channel layer which continues into the side surface of the interface layer, and (d) a top surface of the channel layer which continues into the side surface of the raised part of the channel layer.

In this way, the interface layer which comprises carbon as main components is provided between the raised part of the channel layer and the channel protection layer. It is therefore possible to reduce carrier mobility through the back channel of the channel layer, and reduce fixed charges moving from the channel protection layer to the channel layer. As a result, it is possible to suppress a leakage current during turning Off.

In addition, the provision of the raised part of the channel layer causes the parts of the channel layer which are located on the both sides of the raised part to be thinner than the raised part. As a result, it is possible to allow the parts of the channel layer under the source electrode and the drain electrode to be thinner. Therefore, it is possible to reduce crossing resistance in a current path (front path) of a current flowing through the non-raised parts on the both sides of the raised part of the channel layer from each of the source electrode and the drain electrode. As a result, a turn-On current can be increased.

In this way, the etching removes parts of the interface layer which are located between the source electrode and the channel layer and between the drain electrode and the channel layer. As a result, there is no interface layer between the source electrode and the channel layer and between the drain electrode and the channel layer. Therefore, carrier mobility is not blocked in a current path of a current flowing through the non-raised parts on the both sides of the raised part of the channel layer from each of the source electrode and the drain electrode. As a result, the crossing resistance can be reduced to increase an ON current.

Furthermore, the etching can evenly remove the unnecessary parts of the interface layer above the substrate. It is thereby possible to reduce variations of turn-ON characteristics of the thin-film semiconductor device for display apparatus on the substrate.

According to the manufacturing method according to the exemplary embodiment, it is possible to manufacture the thin-film semiconductor device for display apparatus which has excellent turn-ON characteristics and turn-OFF characteristics and a high reliability without variations of turn-ON characteristics.

Furthermore, the predetermined etching method may include dry etching.

In this way, the dry etching can easily remove the unnecessary parts of the interface layer.

Still further, the method may include, between the forming of the interface layer and the forming of the source electrode and the drain electrode, forming two contact layers each of which is provided on a part of a top surface and a side surface of a corresponding one of the both sides of the channel protection layer, a side surface of the interface layer which continues into the side surface of the channel protection layer, a side surface of the raised part of the channel layer which continues into the side surface of the interface layer, and a part of the top surface of the channel layer which continues into the side surface of the raised part of the channel layer. The method may include, in the forming of the source electrode and the drain electrode, forming the source electrode which is provided on the one of the two contact layers and the drain electrode which is provided on the other one of the tow contact layers.

Still further, the method desirably includes performing oxygen plasma processing on the channel protection layer, at a certain stage between the forming of the interface layer and the forming of the source electrode and the drain electrode.

In general, the channel protection layer comprising an organic material includes a large amount of fixed charges and trapping centers, in comparison to the channel protection layer comprising silicon oxide.

According to the exemplary embodiment, the method includes performing of the oxygen plasma processing on the channel protection layer at a certain stage between the forming of the interface layer and the forming of the source electrode and the drain electrode. More specifically, the oxygen plasma processing is performed on the channel protection layer after forming the interface layer by baking the channel protection layer to generate the interface layer at the interface between the channel region and the channel protection layer.

The oxygen plasma processing dissolves the organic components in the channel protection layer to insert oxygen atoms into the frameworks of molecules in the channel protection layer. As a result, the channel protection layer becomes a film having frameworks and compositions which are similar to those of a silicon oxide film. This reduces a possibility that electrons moving from the source electrode to the drain electrode are trapped by the organic components in the channel protection layer. As a result, the shift of the threshold voltage is suppressed to improve reliability as a device.

In addition, the oxygen plasma processing can dissolve the organic components in the channel protection layer to reduce fixed charges in the channel protection layer. As a result, the back channel conduction is suppressed to suppress an Off-current, thereby improving turn-Off characteristics.

Still further, the oxygen plasma processing may dissolve an organic component in the channel protection layer and bonds oxygen atoms to the silicon in the channel protection layer to be silicon oxide.

Still further, the oxygen plasma processing may be performed at a power concentration range from 3 W/cm$^2$ to 30 W/cm$^2$, a temperature range from 50° C. to 350° C., and a pressure range from 1 Torr to 10 Torr.

In this way, the organic components in the channel protection layer are dissolved to cause the channel protection layer to be a film similar to a silicon oxide film.

Still further, the method may include performing second baking on the channel protection layer, at a certain stage between the forming of the interface layer and the forming of the source electrode and the drain electrode.

In this way, the second baking is performed on the channel protection layer at a certain stage between the forming of the interface layer and the forming of the source electrode and the drain electrode. It is thereby possible to dissolve the organic components in the channel protection layer to reduce fixed charges in the channel protection layer. As a result, the back channel conduction can be suppressed to suppress OFF-current, thereby improving turn-OFF characteristics.

Still further, the method may include performing second baking on the channel protection layer prior to the oxygen plasma processing.

In this way, it is possible to prevent a rapid change in compositions or in a volume of the channel protection layer, and prevent the channel protection layer from being cracked, for example.

Still further, the second baking may be performed at a temperature range from 300° C. to 350° C.

In this way, the organic components in the channel protection layer are dissolved to cause the channel protection layer to be a film similar to a silicon oxide film.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

(Embodiments)

The following describes thin-film semiconductor devices for display apparatuses and methods of manufacturing the same according to exemplary embodiments with reference to the drawings.

(Embodiment 1)

First, a thin-film semiconductor device 10 for display apparatus according to Embodiment 1 is described.

(Structure of Thin-Film Semiconductor Device for Display Apparatus)

FIG. 1 is a cross-sectional view schematically illustrating a structure of the thin-film semiconductor device 10 for display apparatus according to Embodiment 1.

As illustrated in FIG. 1, the thin-film semiconductor device 10 for display apparatus according to Embodiment 1 is a channel-protection bottom-gate thin-film transistor device. The thin-film semiconductor device 10 for display apparatus includes a substrate 1; and a gate electrode 2, a gate insulation film 3, a channel layer 4, and a channel protection layer 5, all of which are sequentially formed above the substrate 1. The thin-film semiconductor device 10 for display apparatus further includes: an interface layer 6 on an interface at the channel layer 4 and the channel protection layer 5; a pair of contact layers 7 above the channel layer 4; and a pair of a source electrode 8s and a drain electrode 8d.

The following describes the structural components of the thin-film semiconductor device 10 for display apparatus according to the present embodiment in detail.

The substrate 1 is a glass substrate comprising, for example, a glass material such as silica glass, alkali-free glass, or highly heat-resistant glass. An undercoat layer comprising a silicon nitride (SiN$_x$) film, a silicon oxide (SiO$_y$) film, a silicon oxynitride (SiO$_y$N$_x$) film, or others may be formed on the substrate 1 in order to prevent impurity such as sodium and phosphorus in the glass substrate from entering the channel layer 4. In addition, the undercoat layer also functions as a layer for buffering the heat on the substrate 1 in a high-temperature thermal treatment process such as laser annealing. The thickness of the undercoat layer ranges, for example, approximately from 100 nm to 2000 nm.

The gate electrode 2 has a single-layer structure or a multi-layer structure that comprises a conductive material, an alloy including the materials, or the like, and comprises, for example, molybdenum (Mo), aluminum (Al), copper (Cu), tungsten (W), titanium (Ti), chromium (Cr), and molybdenum-tungsten (MoW), for example. Such gate electrode 2 is patterned on the substrate 1 in a predetermined shape. The thickness of the gate electrode 2 ranges, for example, approximately from 20 nm to 500 nm.

The gate insulation film 3 is, for example, a single-layer film of silicon oxide (SiO$_y$), silicon nitride (SiN$_x$), a silicon oxynitride (SiO$_y$N$_x$) film, aluminum oxide (AlO$_z$), or tantalum oxide (TaO$_w$), or a multi-layer film of at least two of these materials. Such gate insulation film 3 is provided above the substrate 1 and on the gate electrode 2 to cover the substrate 1 on which the gate electrode 2 is provided.

In the present embodiment, a crystalline silicon thin film is used as the channel layer 4. Accordingly, silicon oxide is desirably used for the gate insulation film 3. The reason for this is that it is desirable to have good interface state between the channel layer 4 and the gate insulation film 3 for maintaining reliable threshold voltage characteristics of the TFT, and silicon oxide is suitable for this purpose. The thickness of the gate electrode 3 ranges, for example, approximately from 50 nm to 300 nm.

The channel layer 4 is a semiconductor layer provided on the gate insulation film 3, having a predetermined channel region in which mobility of carriers are controlled by the voltage at the gate electrode 2. In the present embodiment, the channel layer 4 is a polycrystalline silicon thin film generated by crystallizing amorphous silicon. This polycrystalline silicon thin film may be a silicon thin film having a mixed crystalline structure of amorphous silicon and crystalline silicon. In order to produce reliable turn-On characteristics, at least the predetermined channel region of the channel layer 4 desirably has crystalline silicon more than amorphous silicon Furthermore, the channel layer 4 has a raised shape (raised part) and flat shapes (flat parts) on the surface. In the channel layer 4, a thickness of the flat parts is less than a thickness of the raised part (a height of the raised part). Furthermore, the raised part of the channel layer 4 is positioned above the gate electrode 2 and has its both ends more internally than the both ends of the gate electrode 2. This means that a gate length (channel length) of the gate electrode 2 is greater than a length of the channel layer 4 in a gate length direction. Therefore, the non-raised parts on both sides of the raised part of the channel layer 4 (namely, the flat parts of the channel layer 4) serve as a path on which charges move between the source electrode 8s and the channel region of the channel layer 4 and a path on which charges move between the drain electrode 8d and the channel region, respectively. That is, the regions of the flat parts of the channel layer 4 which are over the gate electrode 2 are thin-film channel regions.

Regarding the thickness of the channel layer 4, a difference between the thickness of the raised part and the thickness of the flat parts is approximately 2 nm or more. The thickness of the raised part ranges approximately from 20 nm to 100 nm, and the thickness of the flat parts ranges approximately from 10 nm to 90 nm. For example, the thickness of the raised part may be 40 nm, and the thickness of the flat parts may be 20 nm. A grain size of the crystalline silicon in the polycrystalline silicon thin film of the channel layer 4 ranges approximately from 5 nm to 1000 nm, for example.

The channel protection layer 5 is a protection film protecting the channel region of the channel layer 4. The channel protection layer 5 is provided on the raised part of the channel layer 4. In the present embodiment, the channel protection layer 5 functions as a Channel Etching Stopper (CES) to prevent the channel region of the channel layer 4 from being etched in etching process for forming the pair of the contact layers 7. This means that the etching process for patterning the contact layers 7 further etches an upper portion (not shown) of the channel protection layer 5. Here, the thickness of the channel protection layer 5 (a part not etched by the channel etching) ranges from 300 nm to 1000 nm, for example. A lower limit of the thickness of the channel protection layer 5 is determined depending on a margin of the channel etching and a capability of suppressing influence of fixed charges in the channel protection layer. An upper limit of the channel protection layer 5 is determined depending on a capability of suppressing a process reliability reduction caused by the increase of a height difference.

The channel protection layer 5 is an organic material layer mainly including organic materials including silicon, oxygen, and carbon. The channel protection layer 5 is not an inorganic material layer mainly comprising inorganic material such as silicon oxide or silicon nitride. The channel protection layer 5 has insulation properties, so that the contact layers 7 in the pair are not electrically connected to each other.

In the present embodiment, the channel protection layer 5 may be formed by patterning a photosensitive coated organic material and solidifying the resulting organic material. The organic material of the channel protection layer 5 is, for example, an organic resin material, a surface active agent, a solvent, and a photosensitizing agent.

As the organic resin material, photosensitive or non-photosensitive organic resin material comprising one or more of polyimide, acrylic, polyamide, polyimide-amide, resist, and benzocyclobutene may be used. As the surface active agent, a surface active agent comprising a silicon compound such as siloxane may be used. As the solvent, an organic solvent such as propyleneglycol monomethylether acetate or 1,4-dioxane may be used. As the photosensitizing agent, a positive photosensitizing agent such as naphthoquinone diazide may be used. Note that, the photosensitizing agent includes carbon and sulfur.

The organic material of the channel protection layer 5 may be coated by a coating method such as the spin coating. Other than the coating method, the organic material may be selectively formed in a predetermined shape by using a liquid drop ejection method or a printing method such as screen printing or offset printing which allows formation of the predetermined pattern.

The interface layer 6 is an insulation layer having insulation properties, and provided at the interface between the top surface of the raised part of the channel layer 4 and the channel protection layer 5. The specific resistance of the interface layer 6 is desirably $2 \times 10^6$ ($\Omega \times cm$) or more. The interface layer 6 is a layer generated in forming the channel protection layer 5 onto the channel layer 4. The interface layer 6 is formed at the interface between the top surface portion of the channel layer 4 and the channel protection layer 5.

Furthermore, the interface layer 6 mainly includes carbon. The carbon as main components derives from the organic material of the channel protection layer 5. This means that the carbon as main components of the interface layer 6 includes the carbon included in the organic material of the channel protection layer 5. In the present embodiment, the interface layer 6 further includes sulfur. The structure of the interface layer 6 will be described later in more detail.

The contact layers 7 in the pair are amorphous semiconductor layers having impurity at high concentration or polycrystalline semiconductor layers having impurity at high concentration, and are provided above the channel layer 4 via the channel protection layer 5. The contact layers 7 in the pair face each other with a predetermined distance on the channel protection layer 5.

In the present embodiment, each of the contact layers 7 in the pair is provided on a corresponding part of the top surface of the channel protection layer 5 and a corresponding one of the flat parts of the channel layer 4, covering the part of the top surface and a side surface of the channel protection layer 5, a side surface of the interface layer 6, and a top surface of the flat part of the channel layer 4. More specifically, the two contact layers 7 are provided at the both sides of the raised part of the channel layer 4, respectively. At each of the both sides, a corresponding one of the two contact layers 7 is provided on a part of the top surface and a side surface of a corresponding one of the both sides of the channel protection layer 5, a side surface of the interface layer 6 which continues into the side surface of the channel protection layer 5, a side surface of the raised part of the channel layer 4 which continues into the side surface of the interface layer 6, and a part of the top surface of the channel layer 4 which continues into the side surface of the raised part of the channel layer 4.

Moreover, each of the contact layers 7 in the pair is, for example, an n-type semiconductor layer formed by doping phosphorus (P) as impurity into amorphous silicon, and is an $n^+$ layer including high-concentration impurity at $1 \times 10^{19}$ atm/cm$^3$ or more. The thickness of each of the contact layers 7 may range, for example, from 5 nm to 100 nm.

Each of the source electrode 8s and the drain electrode 8d is provided over a part of the top surface and a side surface of a corresponding one of the both sides of the channel protection layer 5, a side surface of the interface layer 6 which continues into the side surface of the channel protection layer 5, a side surface of the raised part of the channel layer 4 which continues into the side surface of the interface layer 6, and a part of the top surface of the channel layer 4 which continues into the side surface of the raised part of the channel layer 4. The source electrode 8s and the drain electrode 8d in the pair face each other with a predetermined distance.

In the present embodiment, the source electrode 8s and the drain electrode 8d in the pair are formed above the channel layer 4 and on the respective contact layers 7. In other words, the source electrode 8s is formed on one of the contact layers 7 in the pair, and the drain electrode 8d is formed on the other one of the contact layers 7.

In the present embodiment, each of the source electrode 8s and the drain electrode 8d may have a single-layer structure or multilayer structure that comprises a conductive material, an alloy including the material, or the like, and comprises, for example, aluminum (Al), molybdenum (Mo), tungsten (W), copper (Cu), titanium (Ti), and chromium (Cr). In the present embodiment, each of the source electrode 8s and the drain electrode 8d may have a three-layer structure of MoW/Al/MoW. The thickness of each of the source electrode 8s and the drain electrode 8d may range, for example, approximately from 100 nm to 500 nm.

Thus, the thin-film semiconductor device 10 for display apparatus according to the present embodiment has the structure as described above.

(Method of Manufacturing Thin-Film Semiconductor Device for Display Apparatus)

Next, the method of manufacturing the thin-film semiconductor device 10 for display apparatus according to Embodiment 1 shall be described with reference to FIGS. 2A to 2M. FIGS. 2A to 2M are cross-sectional views schematically illustrating respective steps in the method of manufacturing the thin-film semiconductor device 10 for display apparatus according to Embodiment 1.

Figure 2A:
FIG. 2A is a cross-sectional view schematically illustrating a step of preparing a substrate in a method of manufacturing the thin-film semiconductor device 10 for display apparatus according to Embodiment 1.

First, as illustrated in FIG. 2A, a glass substrate is prepared as the substrate 1. Prior to forming of the gate electrode 2, an undercoat layer comprising a silicon nitride film, a silicon oxide film, or a silicon oxynitride film may be formed on the substrate 1 by the plasma CVD or the like.

Figure 2B:
FIG. 2B is a cross-sectional view schematically illustrating a step of forming a gate electrode in the method of manufacturing the thin-film semiconductor device 10 for display apparatus according to Embodiment 1.

Next, as illustrated in FIG. 2B, the gate electrode 2 in a predetermined shape is formed on/above the substrate 1. For example, the gate electrode 2 in the predetermined shape may be formed by forming a gate metal film comprising molybdenum-tungsten (MoW) on the substrate 1 through sputtering, and by patterning the gate metal film using the photolithography and the wet etching. The wet etching on MoW may be performed using a chemical solution which is a mixture of phosphoric acid ($HPO_4$), nitric acid ($HNO_3$), acetic acid ($CH_3COOH$) and water in a predetermined ratio, for example.

Figure 2C:
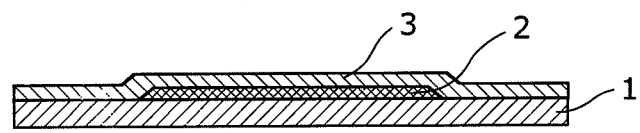
FIG. 2C is a cross-sectional view schematically illustrating a step of forming a gate insulation film in the method of manufacturing the thin-film semiconductor device 10 for display apparatus according to Embodiment 1.

Next, as illustrated in FIG. 2C, the gate insulation film 3 is formed above the substrate 1 on which the gate electrode 2 is formed. For example, the gate insulation film comprising silicon oxide is formed by the plasma CVD or the like to cover the gate electrode 2. Silicon oxide is formed, for example, by introducing silane gas ($SiH_4$) and nitrous oxide gas ($N_2O$) in a predetermined ratio of concentration, for example.

Figure 2D:
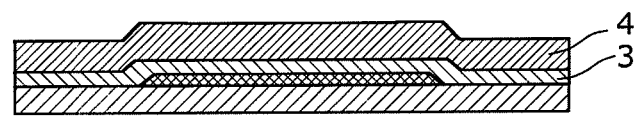
FIG. 2D is a cross-sectional view schematically illustrating a step of forming a channel layer in the method of manufacturing the thin-film semiconductor device 10 for display apparatus according to Embodiment 1.

Next, as illustrated in FIG. 2D, the channel layer 4 that is a crystalline silicon thin film is formed on the gate insulation film 3.

In this case, first, an amorphous silicon thin film comprising amorphous silicon is formed on the gate insulation film 3 by the plasma CVD or the like. As film-forming conditions for forming the amorphous silicon thin film, the amorphous silicon thin film is formed by introducing silane gas ($SiH_4$) and hydrogen gas ($H_2$) in a predetermined ratio of concentration, for example.

After that, a dehydrogenation annealing is performed at a temperature of 400° C. or higher that allows hydrogen to be removed from the amorphous silicon thin film. Then, the amorphous silicon thin film is annealed to be crystallized at a temperature rage from 500° C. to 900° C. As a result, the channel layer 4 that is a crystalline silicon thin film can be formed on the gate insulation film 3.

In the present embodiment, the amorphous silicon thin film is crystallized by the laser annealing using excimer laser. As the method for crystallization, methods, such as laser annealing using a pulse laser with a wavelength range approximately from 370 nm to 900 nm, laser annealing using a continuous wave laser with a wavelength of approximately 370 nm to 900 nm, annealing by Rapid Thermal Processing (RTP), or direct growth forming by the CVD, may be used.

Figure 2E:
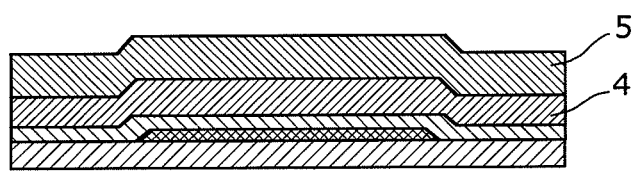
FIG. 2E is a cross-sectional view schematically illustrating a step of coating a channel protection layer in the method of manufacturing the thin-film semiconductor device 10 for display apparatus according to Embodiment 1.

Next, as illustrated in FIG. 2E, a predetermined organic material of the channel protection layer 5 is coated on the channel layer 4 by a predetermined coating method, thereby forming the channel protection layer 5. For example, coating or spin coating of the predetermined organic material is applied on the channel layer 4 in order to provide the channel protection layer 5 all over the top surface of the channel layer 4. The thickness of the channel protection layer 5 can be controlled by a viscosity of the organic material or coating conditions (rotation frequency, blade speed, or the like).

Note that the predetermined organic material of the channel protection layer 5 may be a photosensitive coated organic material including silicon, oxygen, and carbon.

Figure 2F:
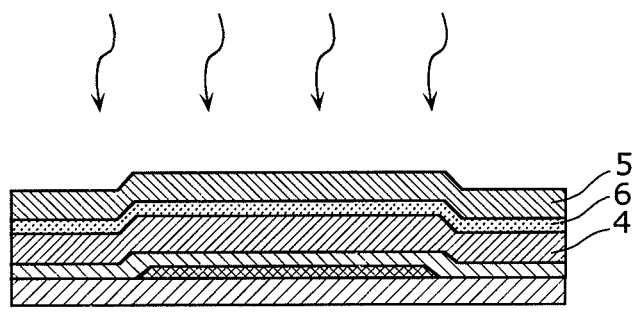
FIG. 2F is a cross-sectional view schematically illustrating a step of prebaking the channel protection layer in the method of manufacturing the thin-film semiconductor device 10 for display apparatus according to Embodiment 1.

After that, as illustrated in FIG. 2F, pre-baking is performed on the channel protection layer 5 to preliminary burn the channel protection layer 5. For example, the channel protection layer 5 is heated at a temperature of approximately 110° C. for approximately 60 seconds. As a result, solvent included in the channel protection layer 5 evaporates.

Here, the burning of the channel protection layer 5 generates the interface layer 6 at the interface between the channel layer 4 and the channel protection layer 5 as illustrated in FIG. 2F. The interface layer 6 generated as above includes carbons as main components. The carbons as main components derive from the organic material of the channel protection layer 5 formed on the channel layer 4.

Figure 2G:
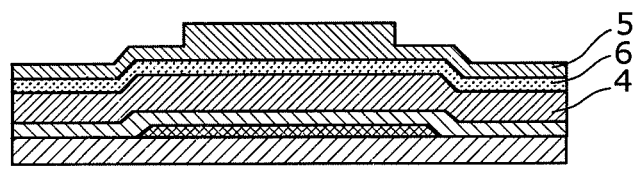
FIG. 2G is a cross-sectional view schematically illustrating a step of lithographic exposure and development on the channel protection layer in the method of manufacturing the thin-film semiconductor device 10 for display apparatus according to Embodiment 1.

Next, as illustrated in FIG. 2G, lithographic exposure and development are performed using a photo mask defining a part (the raised part of the channel layer 4) of the channel protection layer 5 having the predetermined shape. The lithographic exposure and development are applied because photosensitive-organic material is used as the channel protection layer 5. It is therefore possible to form the channel protection layer 5 having the predetermined shape on the part to be the raised part of the channel layer 4. The developer may be 2.38% water solution of Tetra Methyl Ammonium Hydroxyde (TMAH).

If photosensitive-organic material is not used as the channel protection layer 5, it is also possible that the channel protection layer 5 is patterned by photolithography or wet etching to form the channel protection layer 5 having the predetermined shape.

Here, as illustrated in FIG. 2G, in the development for pattern-forming the channel protection layer 5, the lower portion of the channel protection layer 5 and corresponding parts of the interface layer 6 are not removed. Therefore, in processing the channel protection layer 5, parts of the channel protection layer 5 remain as residues. Furthermore, it has been seen that, even if the residues of the channel protection layer 5 do not remain, in the development for pattern-forming the channel protection layer 5, the unnecessary parts of the interface layer 6 cannot be completely removed so that the unnecessary parts of the interface layer 6 remain exposed.

Figure 2H:
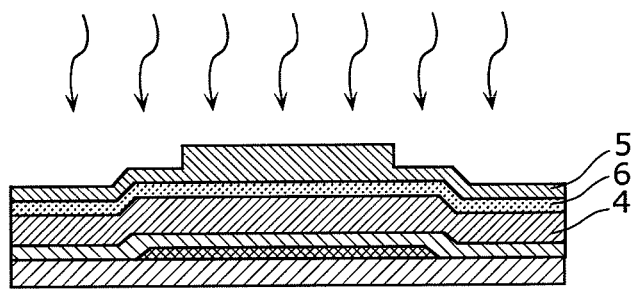
FIG. 2H is a cross-sectional view schematically illustrating a step of post-baking the channel protection layer in the method of manufacturing the thin-film semiconductor device 10 for display apparatus according to Embodiment 1.

Next, as illustrated in FIG. 2H, the patterned channel protection layer 5 is post-baked to be principally burned. For example, the channel protection layer 5 is heated at a temperature range approximately from 280° C. to 300° C. for approximately one hour. As a result, a part of the organic components in the channel protection layer 5 evaporates and is dissolved to have improved film quality.

Figure 2I:
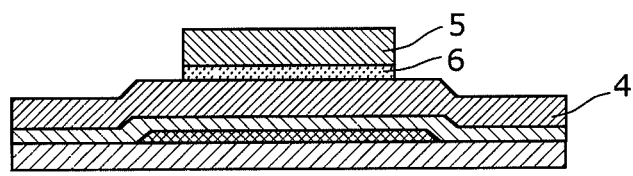
FIG. 2I is a cross-sectional view schematically illustrating a step of etching (first stage) in the method of manufacturing the thin-film semiconductor device 10 for display apparatus according to Embodiment 1.
Figure 2J:
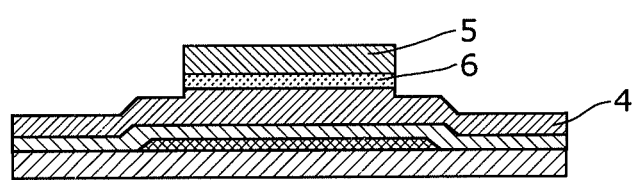
FIG. 2J is a cross-sectional view schematically illustrating a step of etching (second stage) in the method of manufacturing the thin-film semiconductor device 10 for display apparatus according to Embodiment 1.

Next, as illustrated in FIGS. 2I and 2J, predetermined etching is applied to remove the residues of the channel protection layer 5 and the unnecessary parts of the interface layer 6 which are under the residues. More specifically, the channel protection layer 5 and the channel layer 4 are etched by the predetermined etching to leave a layer below the desired channel protection layer 5 having the predetermined shape, which produces the raised part of the channel layer 4 according to the predetermined shape of the channel protection layer 5.

Here, the predetermined etching may be, for example, dry etching by reactive ion etching. The dry etching is desirably performed at two stages as illustrated in FIGS. 2I and 2J.

In this case, as illustrated in FIG. 2I, in the etching at the first stage, the residues of the channel protection layer 5 which are the both ends of the channel protection layer 5 and the unnecessary parts of the interface layer 6 which are under the residues are removed by etching using oxygen gas.

Next, as illustrated in FIG. 2J, in the etching at the second stage, the residues of the channel protection layer 5 which are the both ends of the channel protection layer 5 and the residues of the interface layer are etched by using mixed gas of carbon tetrafluoride ($CF_4$) and hydrogen or mixed gas of fluoro-methane and oxygen, in order to remove regions of the channel layer 4 which are not covered with the channel protection layer 5. As a result, the channel layer 4 has the raised shape.

As described above, the etching is performed at two stages, and in the etching at the first stage, the residues of the channel protection layer 5 which are the both ends of the channel protection layer 5 and the unnecessary parts of the interface layer 6 which are under the residues are removed. As a result, it is possible to prevent an undesired mask from causing shape anomaly on the channel layer 4. More specifically, if etching is performed to generate the raised shape of the channel layer 4 when the residues of the channel protection layer 5 and the unnecessary parts of the interface layer 6 which are under the residues remain, the residues of the channel protection layer 5 and the unnecessary parts of the interface layer 6 sometimes serve as an undesired mask to cause the raised part of the channel layer 4 to have an undesired shape. However, the above-described etching at the first stage can remove such undesired mask.

In addition, the etching at the second stage uses mixed gas to lower the etching rate, thereby improving a controllability of the thickness at the both ends of the raised part. For example, if a hydrogen concentration in the mixed gas of fluoro-methane and hydrogen is varied from 0% to 50%, the etching rate can be controlled in a range from 40 nm/min 1 nm/min. It is therefore possible to remove the residues positioned at the both ends of the channel protection layer 5 and the unnecessary parts of the interface layer 6 which are under the residue, all of which have not been removed in the etching at the first state, and also to cause the channel layer 4 to have the desired raised shape.

Therefore, the channel protection layer 5 having the predetermined shape remains on the raised part of the channel layer 4, thereby allowing the channel layer 4 to have the raised part and also the flat parts corresponding to the etched regions. As a result, the parts (flat parts) of the channel layer 4 which are not covered with the channel protection layer 5 are exposed.

Although it has been described in the present embodiment that the predetermined etching is performed at two stages, it is not necessary to always perform the etching separately at two stages.

Figure 2K:
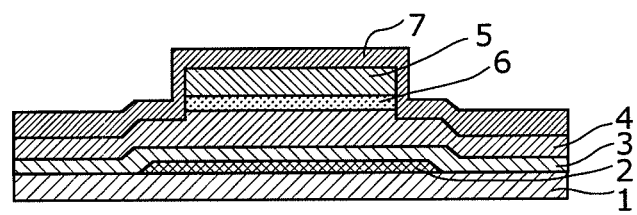
FIG. 2K is a cross-sectional view schematically illustrating a step of forming a contact layer in the method of manufacturing the thin-film semiconductor device 10 for display apparatus according to Embodiment 1.

Next, as illustrated in FIG. 2K, the contact layer 7 is formed on the top surface of the channel protection layer 5 and the flat parts of the channel layer 4. More specifically, for example by plasma CVD, the contact layer 7 comprising amorphous silicon doped with impurity of quinquevalent element such as phosphorus is formed to cover the channel protection layer 5, which is provided on the raised part of the channel layer 4, and the flat parts of the channel layer 4.

Figure 2L:
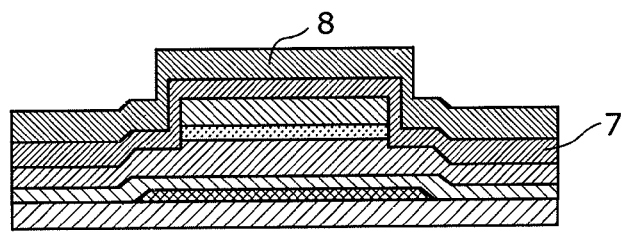
FIG. 2L is a cross-sectional view schematically illustrating a step of forming a source drain metal film in the method of manufacturing the thin-film semiconductor device 10 for display apparatus according to Embodiment 1.

Next, as illustrated in FIG. 2L, a source drain metal film 8, which is to be the source electrode 8s and the drain electrode 8d, is formed to cover the contact layer 7. For example, spattering is used to form the source drain metal film 8 having a three-layer structure of MoW/Al/MoW.

After that, although not illustrated, in order to form the source electrode 8s and the drain electrode 8d in a predetermined shape, a resist material is coated on the source drain metal film 8, and lithographic exposure and development are performed to form a resist patterned in the predetermined shape.

Figure 2M:
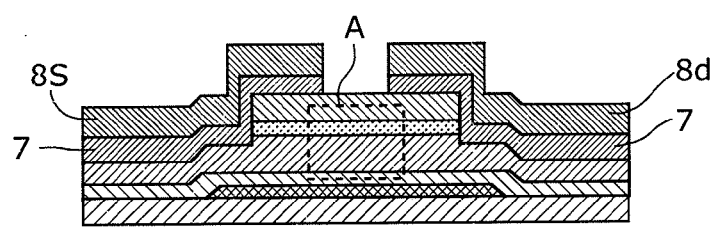
FIG. 2M is a cross-sectional view schematically illustrating a step of patterning the contact layer and patterning a source electrode and a drain electrode in the method of manufacturing the thin-film semiconductor device 10 for display apparatus according to Embodiment 1.

Next, wet etching using this resist a mask is performed to pattern the source drain metal film 8, so as to form the source electrode 8s and the drain electrode 8d having the predetermined shape as illustrated in FIG. 2M. Here, the contact layer 7 functions as an etching stopper. Then, the resists on the source electrode 8s and the drain electrode 8d are removed.

After that, as illustrated in FIG. 2M, dry etching uses the source electrode 8s and the drain electrode 8d as a mask to pattern the contact layer 7 and also pattern the channel layer 4 to have an island shape. As a result, it is possible to form the pair of the contact layers 7 in the predetermined shape and the channel layer 4 in the island shape. In the dry etching, chlorine gas is desirable. Furthermore, in patterning the contact layer 7 and the channel layer 4, it is also possible to perform dry etching using a resist mask after the wet etching on the source electrode 8s and the drain electrode 8d.

Thus, the thin-film semiconductor device 10 for display apparatus according to the present embodiment can be manufactured as described above.

(Structure of Interface Layer of Thin-Film Semiconductor Device for Display Apparatus)

Figure 3A:
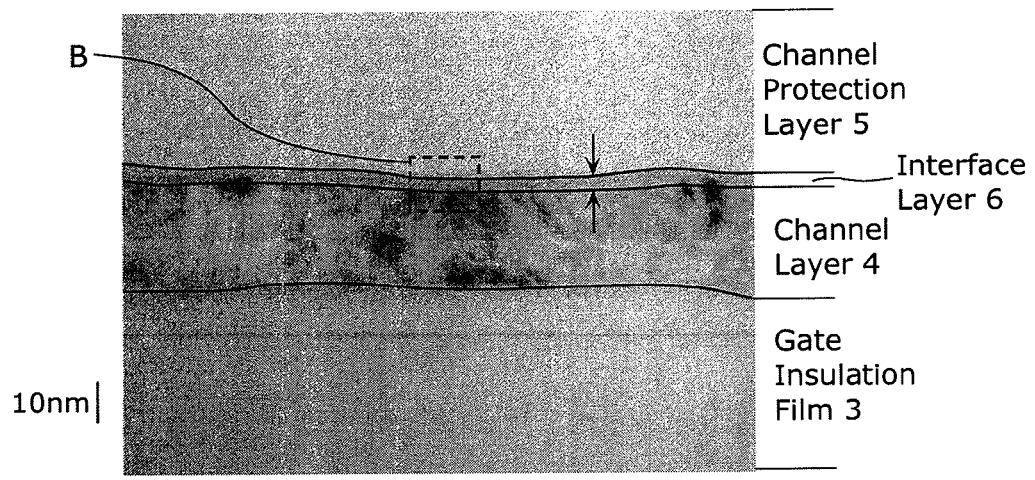
FIG. 3A is a cross-sectional Transmission Electron Microscope (TEM) image of a region A surrounded by a broken line in FIG. 2M regarding the thin-film semiconductor device 10 for display apparatus which is manufactured by the manufacturing method according to claim 1.
Figure 3B:
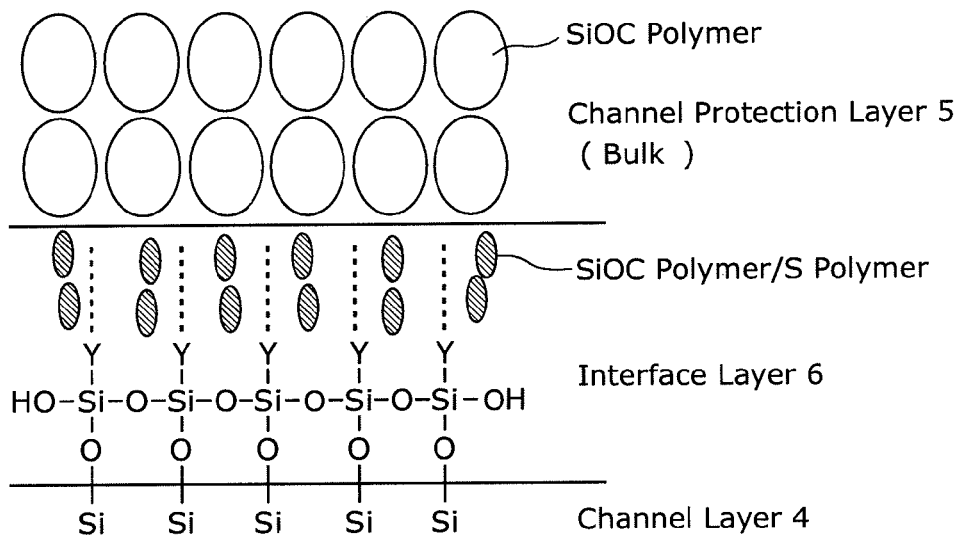
FIG. 3B is a schematic diagram for explaining a cross-sectional structure of a region B surrounded by a broken line in FIG. 3A.

The following describes the structure of the interface layer 6 of the thin-film semiconductor device 10 for display apparatus according to the present embodiment manufactured as above with reference to FIGS. 3A and 3B. FIG. 3A is a cross-sectional TEM image of the thin-film semiconductor device 10 for display apparatus (region A surrounded by a broken line in FIG. 2M) which is manufactured by the above-described manufacturing method. FIG. 3B is a schematic diagram for explaining a cross-sectional structure of a region B surrounded by a broken line in FIG. 3A.

As illustrated in FIG. 3A, if the thin-film semiconductor device 10 for display apparatus is manufactured as described above, it is seen that the thin-film interface layer 6 is formed at the interface between the channel layer 4 that is a crystalline silicon thin film and the channel protection layer 5. Furthermore, FIG. 3A shows that the interface layer 6 has a thickness of approximately 2 nm.

As described above, the interface layer 6 is a layer generated in heating and solidifying the channel protection layer 5. As illustrated in FIG. 3B, it is supposed that, in a part of the interface layer 6 closer to the channel layer 4, silicon compounds as surface active agent included in the material of the channel protection layer 5 are bonded with silicon atoms in the channel layer 4.

More specifically, as illustrated in FIG. 3B, at the interface between the interface layer 6 and the channel layer 4, Y—Si—(O)$_3$ of surface active agent is bonded with Si of the crystalline silicon thin film to produce Si—O—Si bond. Here, Y in Y—Si—(O)$_3$ is a functional group that is reaction-bonded to organic material. Examples of Y are an amino group, an epoxy group, a methacryl group, a vinyl group, a mercapto group, and the like.

Moreover, a part of the interface layer 6 closer to the channel protection layer 5 has SiOC polymer (a thin film including, as main elements, at least Si, O, and C) and S (sulfur) polymer (a thin film including, as structural elements, Si, O, C, and S). The SiOC polymer is supposed as being produced when silicon compounds as surface active agent in the channel protection layer 5 and the carbons included in photosensitive-organic resin material are polymerized. The S polymer is supposed as a thin film produced when the photosensitizing agent, the surface active agent, and the photosensitizing agent included in the organic material of the channel protection layer 5 are polymerized.

As described above, the interface layer 6 is supposed to have a structure where Si—O—Si bond and polymer are arranged in complicated manner in a matrix. On the interface layer 6, there is the channel protection layer 5 having bulk SiOC polymer.

It is seen in FIG. 3A that the interface layer 6 has material different from those of the channel layer 4 and the channel protection layer 5. That is, the TEM image in FIG. 3A shows a layer between the channel layer 4 and the channel protection layer 5 in contrast with the channel layer 4 and the channel protection layer 5. In the TEM image, the difference in contrast shows a difference in material density. That is, the difference shows existence of a difference layer. This means that there is the interface layer 6 as the difference layer between the channel layer 4 and the channel protection layer 5.

Figure 4:
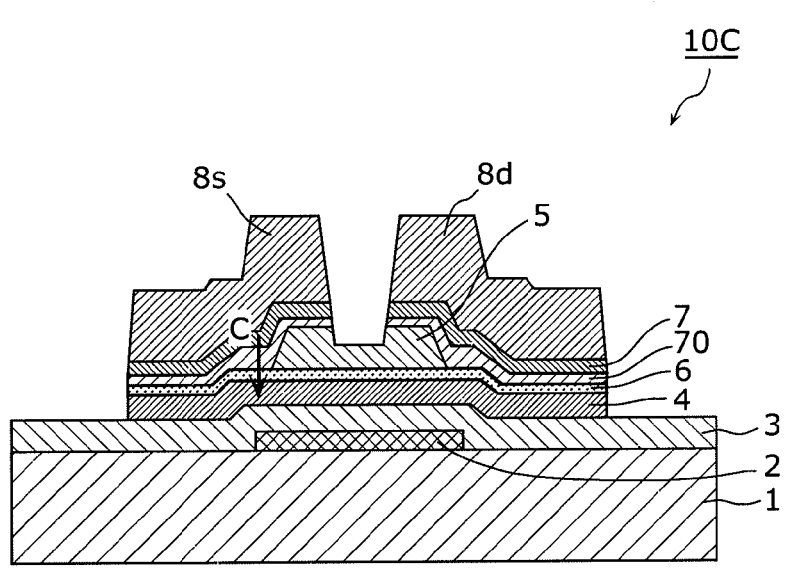
FIG. 4 is a cross-sectional view of a thin-film semiconductor device for display apparatus according to a variation of Embodiment 1.
Figure 5:
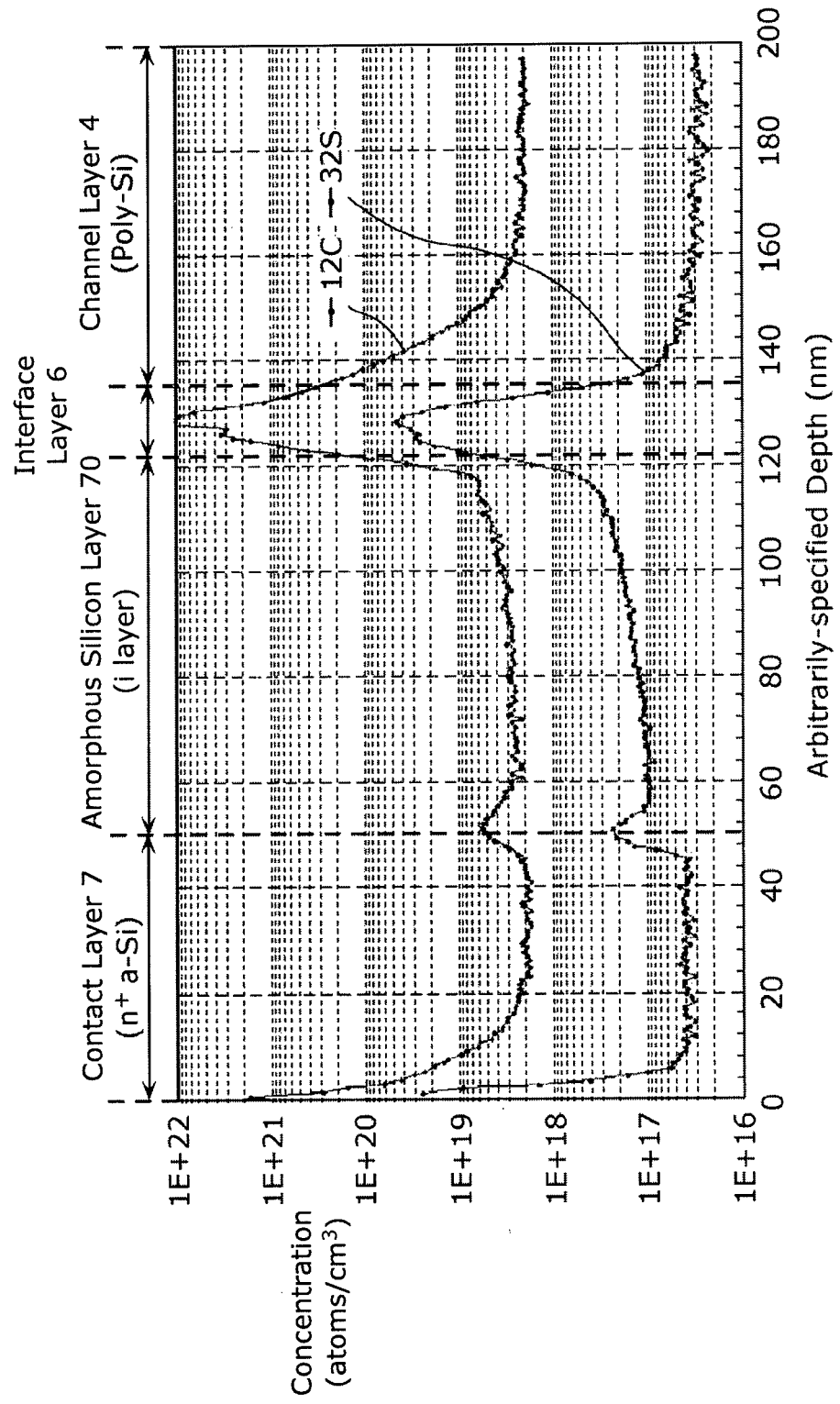
FIG. 5 is a graph plotting carbon concentration distribution and sulfur concentration distribution in a film in the thin-film semiconductor device for display apparatus according to the variation illustrated in FIG. 4.

Next, carbon (C) concentration distribution and sulfur (S) concentration distribution in the thin-film semiconductor device for display apparatus according to the present embodiment are described with reference to FIGS. 4 and 5. FIG. 4 is a cross-sectional view of the thin-film semiconductor device 10C for display apparatus according to a variation of Embodiment 1. The thin-film semiconductor device 10C for display apparatus is manufactured to measure the carbon concentration distribution and the sulfur concentration distribution. FIG. 5 is a graph plotting carbon concentration distribution and sulfur concentration distribution in the thin-film semiconductor device 10 for display apparatus illustrated in FIG. 4. In FIG. 5, a concentration of each of the elements is measured in a thickness (depth) direction shown by an arrow C in FIG. 4, by using secondary ion mass spectrometry (SIMS).

The thin-film semiconductor device 10C for display apparatus illustrated in FIG. 4 is manufactured without the etching (FIG. 2I) for removing the unnecessary parts of the interface layer 6 in the above-described manufacturing method in order to measure the element concentrations in the interface layer 6. In the thin-film semiconductor device 10C for display apparatus illustrated in FIG. 4, an amorphous silicon layer 70 is formed between the contact layer 7 and the source electrode 8s and between the contact layer 7 and the drain electrode 8d.

In the thin-film semiconductor device 10C for display apparatus illustrated in FIG. 4, if concentration of carbon and concentration of sulfur are measured in a depth direction shown by the arrow C at the position of the arrow C in FIG. 4, in other words, if concentration of carbon and concentration of sulfur are measured in order of the contact layer 7, the amorphous silicon layer 70, the interface layer 6, and the channel layer 4, sequentially, the measurement results shown in FIG. 5 are obtained. Here, in FIG. 5, the curve shown as "12C" indicates concentration distribution of carbon, and the curve shown as "32S" indicates concentration distribution of sulfur.

As seen in FIG. 5, carbon concentration and sulfur concentration in the interface layer 6 are higher than those in the other layers. The carbon concentration included in the interface layer 6 is $5 \times 10^{20}$ atoms/cm$^3$ or more, and the sulfur concentration in the interface layer 6 is $5 \times 10^{19}$ atoms/cm$^3$ or more.

It is also seen that the carbon concentration of the interface layer 6 is 50 times as much as the concentration of the carbon included as impurity in the channel layer 4. It is also seen that the sulfur concentration of the interface layer 6 is 100 times as much as the concentration of the sulfur included as impurity in the channel layer 4.

Here, the measurement results in FIG. 5 are regarding the thin-film semiconductor device 10C for display apparatus illustrated in FIG. 4. However, the interface layer 6 between the channel layer 4 and the channel protection layer 5 is the same as the interface layer 6 between the channel layer 4 and the amorphous silicon layer 70. Therefore, the thin-film semiconductor device 10 for display apparatus also provides the same measurement results as those in FIG. 5.

(Effects)

Figure 6A:
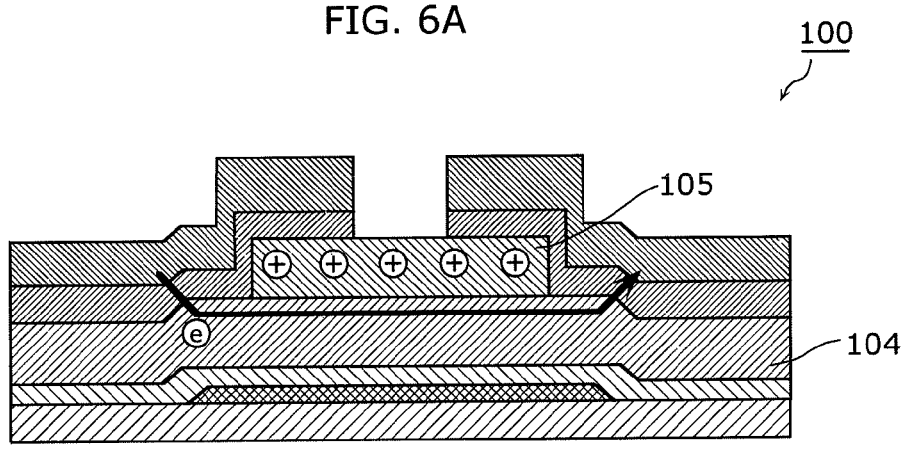
FIG. 6A is a diagram for explaining effects of a thin-film semiconductor device 100 for display apparatus according to a conventional art.
Figure 6B:
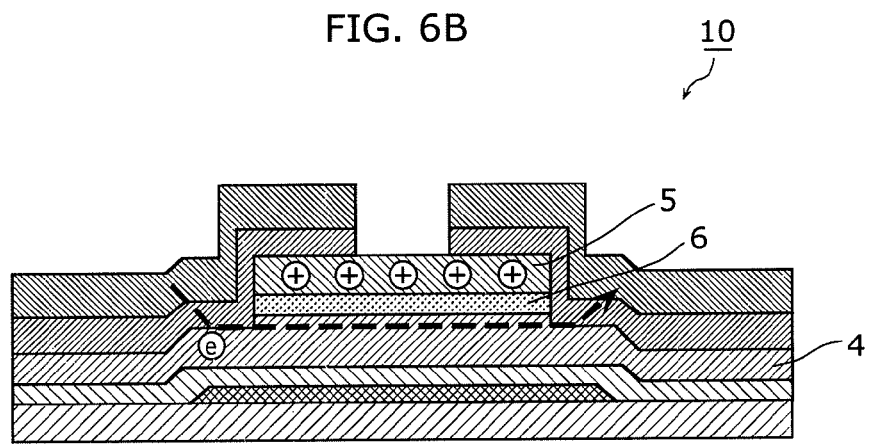
FIG. 6B is a diagram for explaining the first effect of the thin-film semiconductor device 10 for display apparatus according to Embodiment 1.

Next, the description is given for the first effect of the thin-film semiconductor device 10 for display apparatus according to Embodiment 1 with reference to FIGS. 6A and 6B. FIG. 6A is a diagram for explaining effect of a thin-film semiconductor device 100 for display apparatus according to a conventional art. FIG. 6B is a diagram for explaining the first effect of the thin-film semiconductor device 10 for display apparatus according to Embodiment 1 illustrated in FIG. 1. Here, each of a solid-line arrow in FIG. 6A and a broken-line arrow in FIG. 6B shows a back channel (back path), namely, a flow of a leakage current.

As illustrated in FIG. 6A, in the thin-film semiconductor device 100 for display apparatus according to the conventional art, a channel protection layer 105 comprising an organic material is provided on the channel layer 104. Since, as illustrated in FIG. 6A, in the thin-film semiconductor device 100 for display apparatus according to the conventional art, the channel protection layer 105 comprises an organic material, positive fixed charges occur in the channel protection layer 105 and a very small voltage (Vf) is applied to the channel layer 104. Therefore, if the voltage (Vf) caused by the fixed charges becomes higher than the threshold voltage (Vbc) of the back channel in the channel layer 104, back channel conduction occurs to operate a parasitic transistor to cause a leakage current to flow through the back channel of the channel layer 104.

In order to address the above problem, the inventors of the present disclosure have conceived to form the interface layer 6, which includes carbons as main components, between the channel layer 4 and the channel protection layer 5, by using organic material as the channel protection layer 5, as illustrated in the thin-film semiconductor device 10 for display apparatus in FIG. 6B.

The resulting interface layer 6 including carbon as main components includes carbon more than that in the channel layer 4. As described above, seine there is the interface layer 6, which includes carbon as main components, at the interface between the raised part of the channel layer 4 and the channel protection layer 5, it is possible to increase scattering at the interface between the channel protection layer 5 and the channel layer 4, and allow the interface layer 6 to function as a barrier blocking mobility of carriers. In other words, it is possible to increase a resistance value of the raised part of the channel layer 4 (upper portion of the channel region). It is therefore possible to decrease carrier move through the back channel region of the channel layer 4.

In addition, even if fixed charges occur in the channel protection layer 5, it is possible to suppress the back channel conduction of carriers, because the interface layer 6 prevents the fixed charges of the channel protection layer 5 from moving to the channel layer 4.

As described above, the thin-film semiconductor device 10 for display apparatus according to Embodiment 1 includes the interface layer 6 which includes carbon as main components between the raised part of the channel layer 4 and the channel protection layer 5. Therefore, the thin-film semiconductor device 10 for display apparatus can decrease carrier mobility through the back channel region of the channel layer 4 and also can decrease move of fixed charges from the channel protection layer 5 to the channel layer 4. As a result, a leakage current during turning Off can be suppressed to improve turn-OFF characteristics.

Figure 7A:
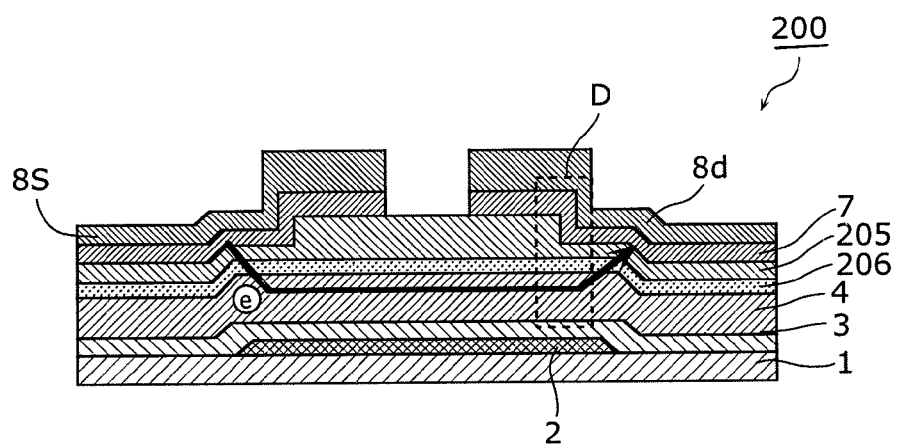
FIG. 7A is a diagram for explaining effects of a thin-film semiconductor device 200 for display apparatus according to another conventional art.
Figure 7B:
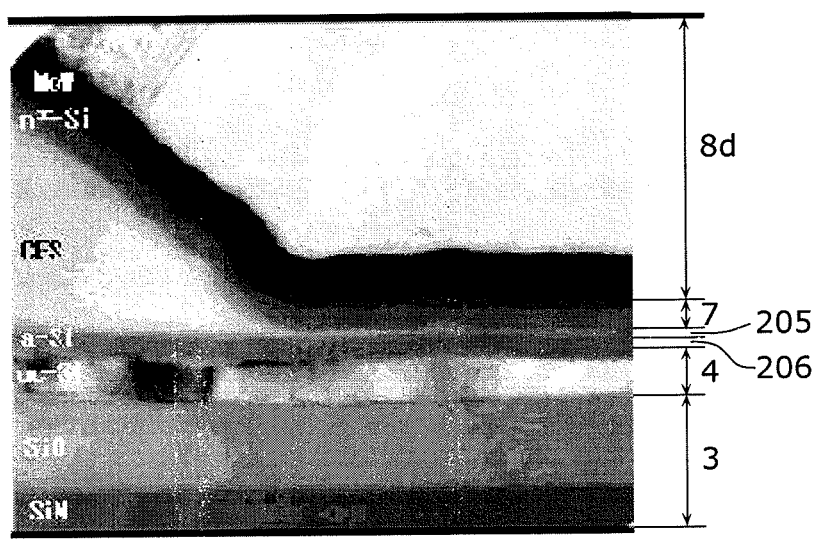
FIG. 7B is a cross-sectional TEM image of a region D surrounded by a broken line in FIG. 7A.
Figure 7C:
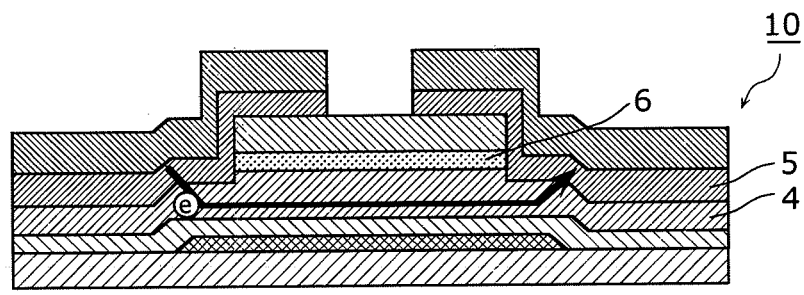
FIG. 7C is a diagram for explaining the second effect of the thin-film semiconductor device 10 for display apparatus according to Embodiment 1.

Next, the description is given for the second effect of the thin-film semiconductor device 10 for display apparatus according to Embodiment 1 with reference to FIGS. 7A to 7C. FIG. 7A is a diagram for explaining effect of a thin-film semiconductor device 200 for display apparatus according to another comparison example. FIG. 7B is a cross-sectional TEM image of a region D surrounded by a broken line in FIG. 7A. FIG. 7C is a diagram for explaining the second effect of the thin-film semiconductor device 10 for display apparatus according to Embodiment 1. Here, each of an arrow in FIG. 7A and a solid-line arrow in FIG. 7C indicates a front channel (front path). Note that the same reference numerals in FIG. 1 are assigned to the identical structural elements in FIG. 7A.

The thin-film semiconductor device 200 for display apparatus according to the comparison example illustrated in FIG. 7A differs from the above-described thin-film semiconductor device 10 for display apparatus according to Embodiment 1 in that the etching (FIG. 2I) for removing the residues of the channel protection layer 5 and the unnecessary parts of the interface layer 6 which are under the residues as illustrated in FIG. 2I and the subsequent steps (FIGS. 2J and 2K) are performed.

Since the etching (FIG. 2I) is not performed, in the thin-film semiconductor device 200 for display apparatus according to the comparison example, an interface layer 206 covers all over the channel layer 4 as illustrated in FIGS. 7A and 7B. Furthermore, as illustrated in FIGS. 7A and 7B, if residues of the channel protection layer 5 remain, the residues of the channel protection layer 5 exist on the locations of the interface layer 6 which correspond to regions except the regions where the desired channel protection layer 5 is formed. Moreover, since the etching is not performed, the channel layer 4 does not have the raised part and therefore does not the flat parts either.

In FIG. 7B, the gate insulation film 3 has a multi-layer structure of silicon nitride (SiN) and silicon oxide (SiO), the channel layer 4 has a multi-layer structure of a polycrystalline silicon film ($\mu$c-Si) and an amorphous silicon film ($\alpha$-Si), the contact layer 7 comprises $n^+$Si, and each of the drain electrode 8$d$ and the source electrode 8$s$ comprises molybdenum (Mo).

The thin-film semiconductor device 200 for display apparatus according to the comparison example, there are residues of the channel protection layer 5 and unnecessary parts of the interface layer 6 between the source electrode 8$s$ and the channel layer 4 and between the drain electrode 8$d$ and the channel layer 4.

In this case, as illustrated in FIG. 7A, a current path during turning Off the thin-film semiconductor device 200 for display apparatus according to the comparison example serves as a path (front path) shown by an arrow, and there are the residues of the channel protection layer 5 and the unnecessary parts of the interface layer 6 in the current path. Therefore, functioning as parasitic resistances (crossing resistances) blocking mobility of carriers, the residues and the unnecessary parts prevent the carriers from flowing through the front path via the non-raised parts on the both sides of the raised part of the channel layer 4 between the source electrode 8$s$ and the drain electrode 8$d$. As a result, an On-current is reduced to considerably decrease turn-On characteristics.

Furthermore, in the case where a plurality of thin-film semiconductor devices are provided on the substrate to form a thin-film transistor array device, the thin-film semiconductor devices on the substrate do not always have the same thickness of the residues of the channel protection layer 5 comprising organic material. Therefore, the function of serving as a parasitic resistance for blocking carrier mobility is not homogeneous, thereby considerably increasing variations of turn-ON characteristics of the thin-film semiconductor devices.

On the other hand, as illustrated in FIG. 7C, in the thin-film semiconductor device 10 for display apparatus according to Embodiment 1, the etching (FIG. 2I) removes the residues of the channel protection layer 5 and the unnecessary parts of the interface layer 6 which are under the residues are removed, and also allows the channel region of the channel layer 4 to be thinner as the flat parts.

As a result, in the thin-film semiconductor device 10 for display apparatus according to Embodiment 1, the residues of the channel protection layer 5 and the interface layer 6 do not exist between the source electrode 8$s$ and the channel layer 4 and between the drain electrode 8$d$ and the channel layer 4.

In this case, as illustrated in FIG. 7C, a current path during turning ON the thin-film semiconductor device 10 for display apparatus according to Embodiment 1 is a path (front path) shown by an arrow, and the residues of the channel protection layer 5 and the interface layer 6 do not exist in the current path. Therefore, carrier mobility is not blocked in a current path of a current flowing through the non-raised parts on the both sides of the raised part of the channel layer 4 from the source electrode 8$s$ or the drain electrode 8$d$. In comparison to the thin-film semiconductor device for display apparatus according to the comparison example, the crossing resistance can be more reduced to increase an ON current. As a result, the turn-ON characteristics can be improved.

In addition, the etching can homogeneously remove the residues of the channel protection layer 5 and the unnecessary parts of the interface layer 6 above the substrate. More specifically, in each of the thin-film semiconductor devices for display apparatuses which are on the substrate, the residues of the channel protection layer 5 and the interface layer 6 are homogeneously removed between the source electrode 8s and the channel layer 4 and between the drain electrode 8d and the channel layer 4 on the substrate. It is thereby possible to reduce the above-described variations of turn-ON characteristics.

Furthermore, the etching can allow the thickness of the parts (flat parts) on the both sides of the raised part of the channel layer 4 to be smaller than the thickness of the raised part. Therefore, regarding the current path of a current flowing through the non-raised parts on the both sides of the raised part of the channel layer 4 from each of the source electrode 8s and the drain electrode 8d, it is possible to decrease the thickness of the channel layer 4 under the source electrode 8s and under the drain electrode 8d. Therefore, it is possible to reduce the crossing resistance in the current path (front path) of a current flowing through the non-raised parts on the both sides of the raised part of the channel layer 4 from each of the source electrode 8s and the drain electrode 8d. As a result, it is possible to significantly increase an ON-current without decreasing a total thickness of the channel layer 4 that is a semiconductor layer.

Furthermore, in this case, in the channel layer 4, a difference between the thickness of the raised part and the thickness of the flat parts is desirably 2 nm or more. This will be described in more detail below.

As illustrated in FIG. 7A, the parts of the interface layer 206 which are located on the both sides of the raised part of the channel protection layer 205 in the predetermined shape has a thickness of approximately from 1 nm to 5 nm. This blocks the current path to decrease turn-ON characteristics and characteristics variations. In order to improve the above situation, as described previously, the parts of the interface layer 206 (unnecessary parts of the interface layer 206) which are located on the both sides of the raised part of the channel protection layer 205 in the predetermined shape may be removed to cause the channel layer 4 to have the raised part as illustrated in FIG. 7C, in order to remove the unnecessary parts of the interface layer 206 to cause the channel layer 4 to have the raised shape part. In short, the removal of the unnecessary parts of the interface layer 206 forms the raised part of the channel layer 4.

As described above, as the flat parts of the channel layer 4 are thinner, more ON-current flows. However, the forming the channel layer 4 to have the raised part to make the flat parts of the channel layer 4 thinner is a different aspect from the forming the channel layer 4 to have the raised part to remove the unnecessary parts of the interface layer 206.

Therefore, in removing the unnecessary parts of the interface layer 206, it is not always necessary to cause the channel layer 4 to have a great difference between the thickness of the raised part and the thickness of the flat parts. In the present embodiment, first, the raised part of the channel layer 4 is formed by removing the unnecessary parts of the interface layer 206. Here, it is desirable that the thickness of the flat parts of the channel layer 4 ranges from 10 nm to 20 nm, and the difference between the thickness of the raised part and the thickness of the flat parts of the channel layer 4 is 2 nm or more.

As a result, it is possible to reduce the crossing resistance in the current path (front path) of a current flowing through the non-raised parts on the both sides of the raised part of the channel layer 4 from each of the source electrode 8s and the drain electrode 8d, thereby improving turn-ON characteristics.

Figure 8A:
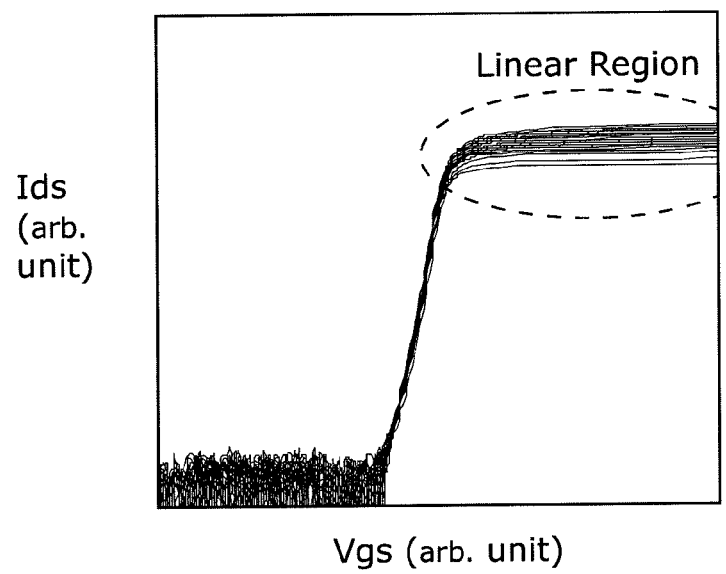
FIG. 8A is a graph plotting changes in logarithm of a drain current Ids to a gate voltage Vgs in the thin-film semiconductor device 100 for display apparatus according to the conventional art.
Figure 8B:
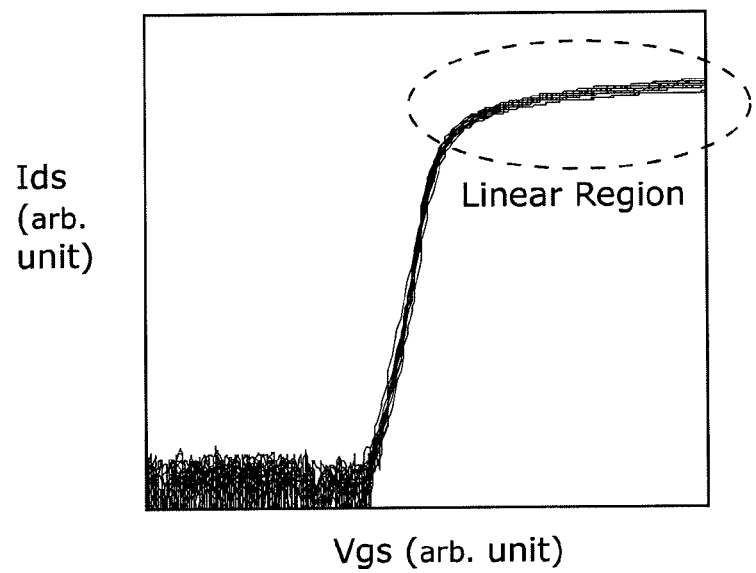
FIG. 8B is a graph plotting changes in logarithm of a drain current Ids to a gate voltage Vgs in the thin-film semiconductor device 10 for display apparatus according to Embodiment 1.

With reference to FIGS. 8A and 8B, the following explains the results of measuring the electrical characteristics of the thin-film semiconductor device 200 for display apparatus according to the comparison example illustrated in FIG. 7A and the thin-film semiconductor device 10 for display apparatus according to Embodiment 1 illustrated in FIG. 7C. FIG. 8A is a graph plotting changes in logarithm of a drain current Ids to a gate voltage Vgs in the thin-film semiconductor device 100 for display apparatus according to the comparison example. FIG. 8B is a graph plotting changes in logarithm of a drain current Ids to a gate voltage Vgs in the thin-film semiconductor device 10 for display apparatus according to Embodiment 1. Each of FIGS. 8A and 8B plots current-voltage characteristics in applying bias between a source and a drain in a linear operation region. Each of FIGS. 8A and 8B shows a plurality of curves that indicate results of measuring a plurality of thin-film semiconductor devices for display apparatuses.

As illustrated in each of FIGS. 8A and 8B, particularly in a part surrounded by a broken line, regarding the thin-film semiconductor device 10 for display apparatus according to Embodiment 1 in FIG. 8B, an ON-current is increased to improve turn-ON characteristics and the characteristics variations among the plurality of subject thin-film semiconductor devices for display apparatuses which are on the same substrate are reduced, in comparison to the plurality of the thin-film semiconductor devices 200 for display apparatuses according to the comparison example in FIG. 7A.

As described above, the thin-film semiconductor device 10 for display apparatus according to Embodiment 1 can improve turn-OFF characteristics by including the interface layer 6 over the raised part of the channel layer 4. In addition, the thin-film semiconductor device 10 for display apparatus can improve turn-ON characteristics and suppress characteristics variations, by not providing the interface layer 6 over the flat parts of the channel layer 4.

Figure 9A:
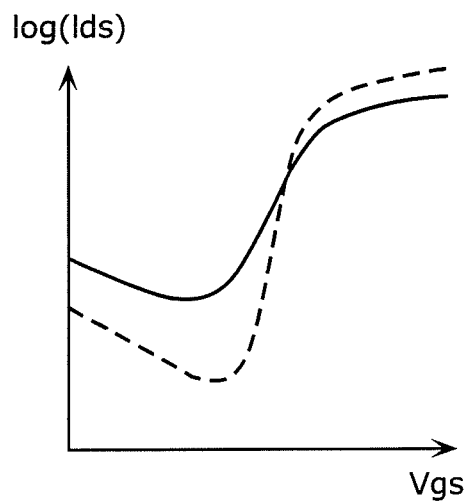
FIG. 9A is a graph plotting changes in logarithm of a drain current Ids to a gate voltage Vgs.
Figure 9B:
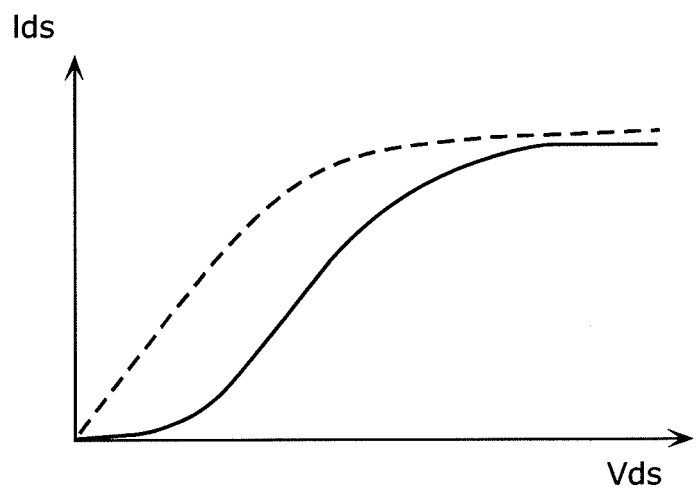
FIG. 9B is a graph plotting changes in logarithm of a drain current Ids to a gate voltage Vgs.

With reference to FIGS. 9A and 9B, the following describes how the effects of the thin-film semiconductor device 10 for display apparatus according to the present embodiment influence the current-voltage characteristics.

FIG. 9A is a graph plotting changes in logarithm of a drain current Ids to a gate voltage Vgs, plotting transmission characteristics of the thin-film semiconductor device for display apparatus. FIG. 9B is a graph plotting changes in logarithm of a drain current Ids to a gate voltage Vgs, plotting output characteristics of the thin-film semiconductor device for display apparatus. In each of FIGS. 9A and 9B, a broken line indicates characteristics of the thin-film semiconductor device 10 for display apparatus according to the present embodiment illustrated in FIG. 1, and a solid line indicates characteristics of the thin-film semiconductor device 100 for display apparatus according to the conventional art illustrated in FIG. 6A.

Referring to FIG. 9A, in comparison to the thin-film semiconductor device 100 for display apparatus according to the conventional art, the thin-film semiconductor device 10 for display apparatus according to the present embodiment has a higher top level of an ON-current. This is desirable characteristics in terms of improvement of a current supply capability of the thin-film semiconductor device for display apparatus which is demanded with display size increase and resolution increase. For example, in an organic EL display device (EL display), the thin-film semiconductor device for display apparatus is used as a switching thin-film semiconductor device (selecting transistor) for selecting pixel and a thin-film semiconductor device (driving transistor) for supplying a current to an organic EL element. In this case, the excellent turn-ON characteristics of the thin-film semiconductor device for display apparatus allow the driving transistor to have a smaller size, and therefore the EL display can increase an aperture ratio and a yield ratio. It is also possible to reduce power consumption.

Moreover, referring to FIG. 9A, in the comparison to the thin-film semiconductor device 100 for display apparatus according to the conventional art, the thin-film semiconductor device 10 for display apparatus according to the present embodiment reduces a bottom level of an OFF-current. Therefore, for example, the thin-film semiconductor device for display apparatus is used as a selecting transistor in an EL display, it is possible to prevent contrast decrease and inhomogeneous image-quality on a panel which are caused by a leakage current due to the excellent turn-OFF characteristics of the thin-film semiconductor device for display apparatus. As a result, excellent data holding characteristics can be ensured.

Furthermore, in comparison to the thin-film semiconductor device 100 for display apparatus according to the conventional art, the characteristics improvement of ON-current and OFF-current allows the thin-film semiconductor device 10 for display apparatus according to the present embodiment to have a better ON-OFF ratio. Therefore, for example, if the thin-film semiconductor device for display apparatus is used as a driving transistor in an EL display, the EL display has a better contrast ratio to improve image quality.

Next, referring to FIG. 9B, regarding the thin-film semiconductor device 100 for display apparatus according to the conventional art, a drain current Ids is small when a drain voltage Vds is small. Regarding the thin-film semiconductor device 10 for display apparatus according to the present embodiment, however, a drain current Ids is large when a drain voltage Vds is small. Therefore, for example, if the thin-film semiconductor device for display apparatus is used as a selecting transistor in an EL display, the EL display can prevent a charging difference between a pixel potential and a data potential in a scan line selection period.

Thus, the effects of the thin-film semiconductor device 10 for display apparatus according to Embodiment 1 have been described. Note that, in the thin-film semiconductor device 10 for display apparatus according to Embodiment 1, the channel protection layer 5 comprises an organic material. Therefore, it possible to form the channel protection layer 5 at a lower temperature and by a coating process. As a result, it is possible to manufacture a thin-film semiconductor device having excellent TFT characteristics by simple facility and at a low cost.

Moreover, it is desirable for the thin-film semiconductor device for display apparatus according to Embodiment 1 that a concentration of carbon included in the interface layer 6 is $5 \times 10^{20}$ (atoms/cm$^3$) or more, and is equal to or more than fifty times as much as a concentration of carbon included as impurity in the channel layer 4. Thereby, it is possible to surely produce the effects of reducing the above-described carrier mobility in the interface layer 6.

Moreover, for the thin-film semiconductor device 10 for display apparatus according to the present embodiment, it is desirable that the interface layer 6 includes sulfur. The sulfur included in the interface layer 6 is the sulfur included in the photosensitizing agent of the organic material of the channel protection layer 5. In other words, the sulfur included in the interface layer 6 derives from the organic material of the channel protection layer 5. Having an atomic radius greater than that of carbon and oxygen, sulfur can prevent carrier mobility more than carbon or oxygen does. Therefore, since the interface layer 6 includes sulfur, the above-described carrier mobility can be further reduced, and the turn-OFF characteristics of the thin-film semiconductor device can be further improved.

Furthermore, it is desirable for the thin-film semiconductor device 10 for display apparatus according to the present embodiment that a concentration of sulfur included in the interface layer 6 is $5 \times 10^{19}$ atoms/cm$^3$ or more, and is equal to or more than one hundred times as much as a concentration of sulfur included as impurity in the channel layer 4. Thereby, it is possible to surely produce the effects of reducing the above-described carrier mobility in the interface layer 6.

It is also desirable for the thin-film semiconductor device 10 for display apparatus according to the present embodiment that the interface layer 6 has insulation properties by which resistivity is $2 \times 10^6$ ($\Omega \times$cm) or more. It is thereby possible to further reduce the above-described carrier mobility in the interface layer 6.

It is further desirable in the method of manufacturing the thin-film semiconductor device 10 for display apparatus according to the present embodiment that hydrogen plasma processing is performed between the crystallization of the channel layer 4 and the coating of the channel protection layer 5. The hydrogen plasma processing causes dangling bond (defection) of silicon atoms of the channel layer 4 to be hydrogen terminated. As a result, the crystal defect density of the channel layer 4 is reduced to improve the crystallinity. As a result, turn-ON characteristics are further improved.

(Embodiment 2)

Next, the description is given for a thin-film semiconductor device 10A for display apparatus according to Embodiment 2 with reference to FIGS. 10A to 10E. FIGS. 10A to 10E are cross-sectional views of a part of the steps in the method of manufacturing the thin-film semiconductor device 10A for display apparatus according to Embodiment 2.

The structure of the thin-film semiconductor device 10A for display apparatus according to Embodiment 2 is the same as the structure of the thin-film semiconductor device 10 for display apparatus according to Embodiment 1 illustrated in FIG. 1.

Embodiment 2 differs from Embodiment 1 in the manufacturing method. More specifically, the method of manufacturing the thin-film semiconductor device 10A for display apparatus according to the present embodiment differs from the method of manufacturing the thin-film semiconductor device 10 for display apparatus according to Embodiment 1 in further including a step of performing oxygen plasma processing on the channel protection layer 5, at a certain stage between the step of forming the interface layer (FIG. 2F) and the step of forming the source electrode and the drain electrode (FIG. 2K).

The following describes the method of manufacturing the thin-film semiconductor device 10A for display apparatus according to Embodiment 2 with reference to FIGS. 10A to 10E and with reference to the method of manufacturing the thin-film semiconductor device 10 for display apparatus according to Embodiment 1 illustrated in FIGS. 2A to 2K.

First, in the same manner as described for the thin-film semiconductor device 10 for display apparatus according to Embodiment 1, the step of preparing the substrate (2A), the step of forming the gate electrode (FIG. 2B), the step of forming the gate insulation film (FIG. 2C), and the step of forming the channel layer (FIG. 2D), the step of coating the channel protection layer (FIG. 2E), the step of pre-baking the channel protection layer (FIG. 2F), the step of lithographic exposure and development on the channel-protection layer (FIG. 2G), and the step of post-baking the channel protection layer (FIG. 2H) are performed sequentially.

Figure 10A:
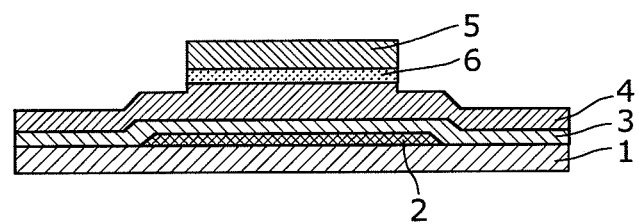
FIG. 10A is a cross-sectional view schematically illustrating a step of etching in a method of manufacturing a thin-film semiconductor device 10A for display apparatus according to Embodiment 2.

Next, as illustrated in FIG. 10A, in the same manner as described with reference to FIG. 2I, predetermined etching is performed. As a result, the residues of the channel protection layer 5 and the unnecessary parts of the interface layer 6 which are under the residues are removed to cause the channel protection layer 5 to have a predetermined shape and cause the channel layer 4 to have the raised part and the flat parts.

Figure 10B:
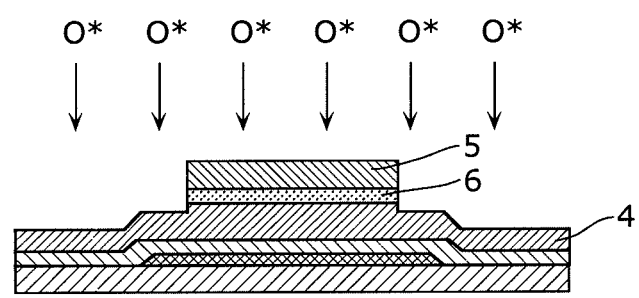
FIG. 10B is a cross-sectional view schematically illustrating a step of oxygen plasma processing in the method of manufacturing the thin-film semiconductor device 10A for display apparatus according to Embodiment 2.

Next, as illustrated in FIG. 10B, oxygen plasma processing is performed on the channel protection layer 5. The oxygen plasma processing produces oxygen plasma including oxygen radical (O*) in a plasma atmosphere. The resulting oxygen plasma dissolves the organic components in the channel protection layer 5, and also generates silicon oxide by bonding the silicon included in the channel protection layer 5 with the oxygen atoms.

The oxygen plasma processing can be performed by producing oxygen plasma by radio-frequency (RF) power using, for example, gas including oxygen gas as material, and irradiating the oxygen plasma on the channel protection layer 5.

Figure 10C:
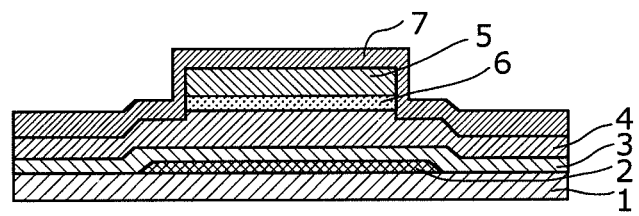
FIG. 10C is a cross-sectional view schematically illustrating a step of forming a contact layer in the method of manufacturing the thin-film semiconductor device 10A for display apparatus according to Embodiment 2.

Next, as illustrated in FIG. 10C, in the same manner as described with reference to FIG. 2J, the contact layer 7 is formed to cover the top surface of the channel protection layer 5 and the flat parts of the channel layer 4.

Figure 10D:
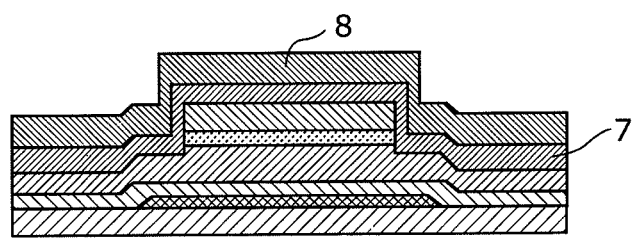
FIG. 10D is a cross-sectional view schematically illustrating a step of forming a source drain metal film in the method of manufacturing the thin-film semiconductor device 10A for display apparatus according to Embodiment 2.

Next, as illustrated in FIG. 10D, in the same manner as described with reference to FIG. 2K, the source drain metal film 8 to be the source electrode 8s and the drain electrode 8d is formed to cover the contact layer 7.

Figure 10E:
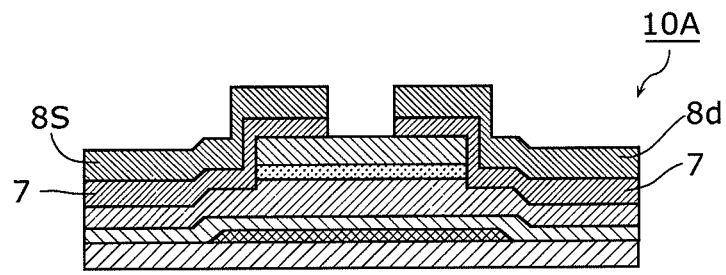
FIG. 10E is a cross-sectional view schematically illustrating a step of patterning on the contact layer and patterning the source electrode and the drain electrode in the method of manufacturing the thin-film semiconductor device 10A for display apparatus according to Embodiment 2.

Next, as illustrated in FIG. 10E, in the same manner as described with reference to FIG. 2L, the source drain metal film 8 is patterned to form the source electrode 8s and the drain electrode 8d to have a predetermined shape, and then form a pair of the contact layers 7 having a predetermined shape and the channel layer having an island shape.

As a result, the thin-film semiconductor device 10A for display apparatus according to Embodiment 2 can be manufactured.

As described above, the thin-film semiconductor device 10A for display apparatus according to Embodiment 2 has the same effects as those of the above-described thin-film semiconductor device 10 for display apparatus according to Embodiment 1.

Furthermore, the method of manufacturing the thin-film semiconductor device 10A for display apparatus according to the present embodiment can produce the following effects by performing the oxygen plasma processing on the channel protection layer 5

Figure 11:
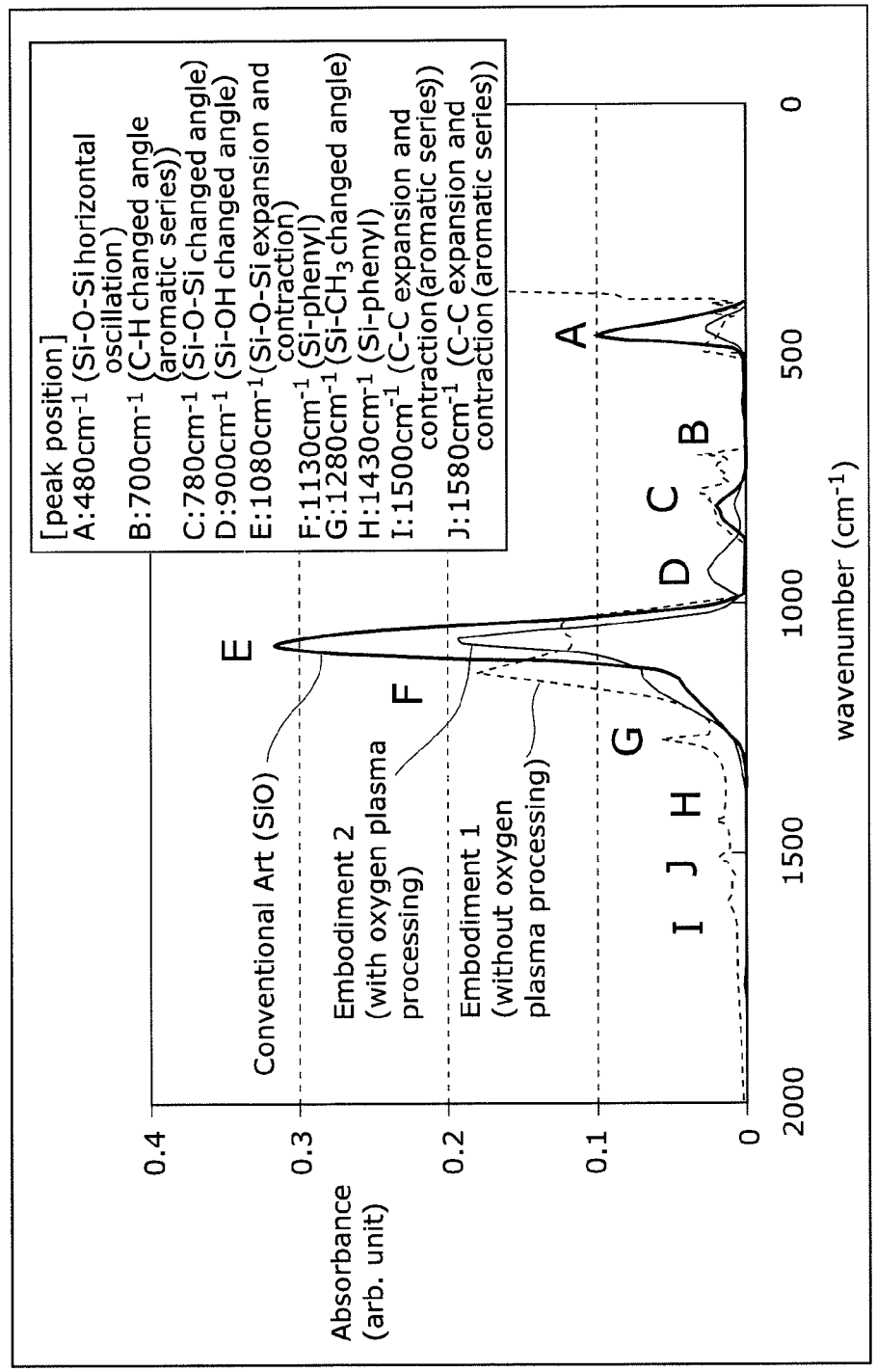
FIG. 11 is a graph plotting IR spectrums of the respective thin-film semiconductor devices for display apparatus according to the conventional art, Embodiment 1, and Embodiment 2.

FIG. 11 is a graph plotting IR spectrums of the respective thin-film semiconductor devices for display apparatuses according to the conventional art, Embodiment 1, and Embodiment 2.

In the thin-film semiconductor device 100 for display apparatus according to the conventional art, thermally-oxidized silicon oxide is used as the channel protection layer 205. The channel protection layer 205 comprising inorganic material has less fixed charges than those in the channel protection layer comprising organic material.

On the other hand, in the thin-film semiconductor device 10 for display apparatus according to Embodiment 1, since the channel protection layer 5 includes organic material, the channel protection layer 5 according to Embodiment 1 has fixed charges more than those in the channel protection layer 205 in the thin-film semiconductor device 100 for display apparatus according to the conventional art. Therefore, as seen in FIG. 11, the IR spectrum of the thin-film semiconductor device 10 for display apparatus according to Embodiment 1 (Embodiment 1) is different from the IR spectrum of the thin-film semiconductor device 100 for display apparatus according to the conventional art (conventional art).

On the other hand, in the thin-film semiconductor device 10A for display apparatus according to the present embodiment, although the coating material of the channel protection layer 5 includes organic material, the oxygen plasma processing is performed on the channel protection layer 5 to dissolve the organic components in the channel protection layer 5 and oxygenize the silicon in the channel protection layer 5. In practice, if the IR spectrum of the thin-film semiconductor device 10A for display apparatus according to Embodiment 2 (Embodiment 2) is measured, as illustrated in FIG. 11, the IR spectrum according to the present embodiment is approximated to the IR spectrum of the thin-film semiconductor device 100 for display apparatus according to the conventional art using inorganic material (silicon oxide) as the channel protection layer. It is therefore seen that the oxygen plasma processing dissolves the organic components in the channel protection layer 5 to oxygenize the silicon in the channel protection layer 5.

Therefore, in comparison to Embodiment 1, the thin-film semiconductor device 10A for display apparatus according to the present embodiment can further reduce fixed charges in the channel protection layer 5. As a result, the back channel conduction can be further suppressed to suppress an OFF-current.

The oxygen plasma processing performed on the post-baked channel protection layer 5 as described in the present embodiment can further suppress shifting of a threshold voltage to improve a reliability as a device, in comparison to Embodiment 1. This will be explained sequentially with reference to FIGS. 12A, 12B, 13A, 13B, and 14.

Figure 12A:
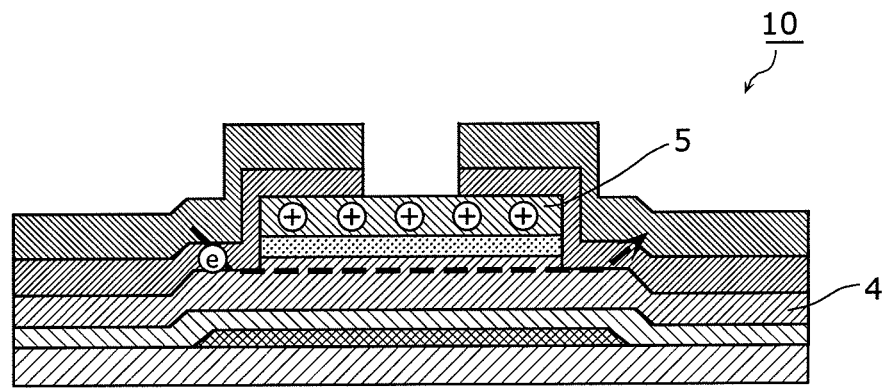
FIG. 12A is a view for explaining effects (back channel) of the thin-film semiconductor device 10 for display apparatus according to Embodiment 1.
Figure 12B:
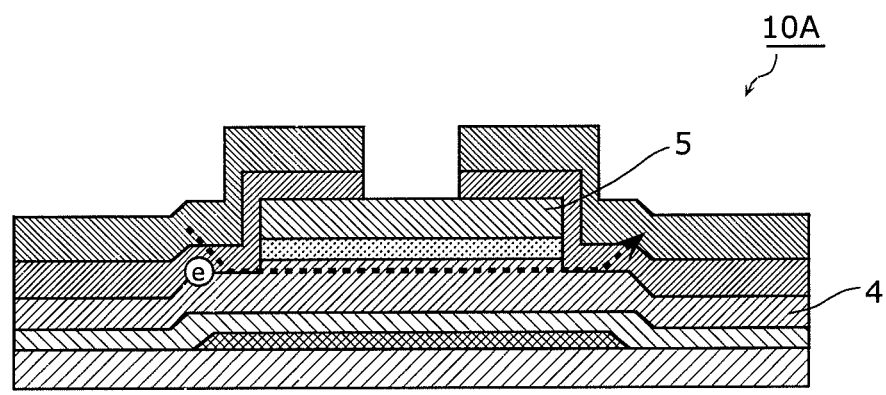
FIG. 12B is a view for explaining the effects of the thin-film semiconductor device 10A for display apparatus according to Embodiment 2.
Figure 13A:
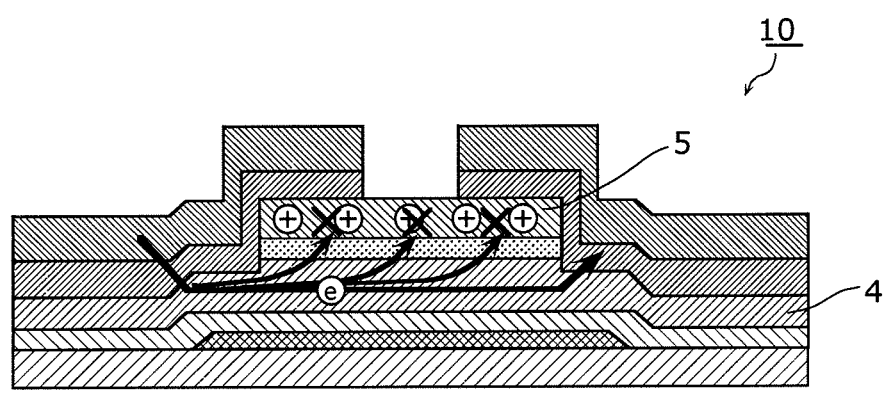
FIG. 13A is a view for explaining effects (carrier trap) of the thin-film semiconductor device 10 for display apparatus according to Embodiment 1.
Figure 13B:
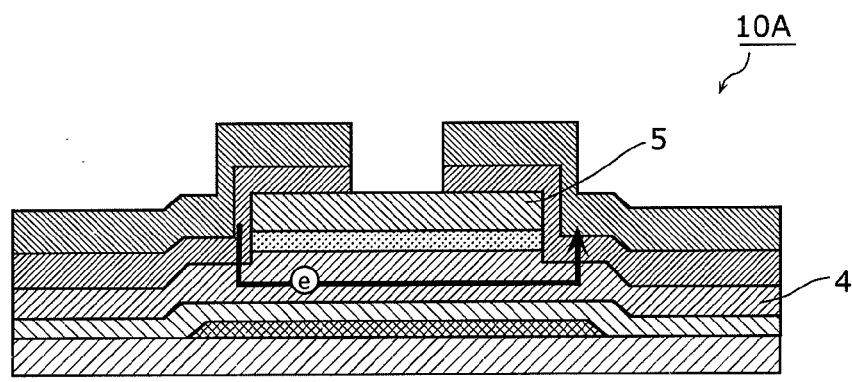
FIG. 13B is a view for explaining the effects of the thin-film semiconductor device 10A for display apparatus according to Embodiment 2.
Figure 14:
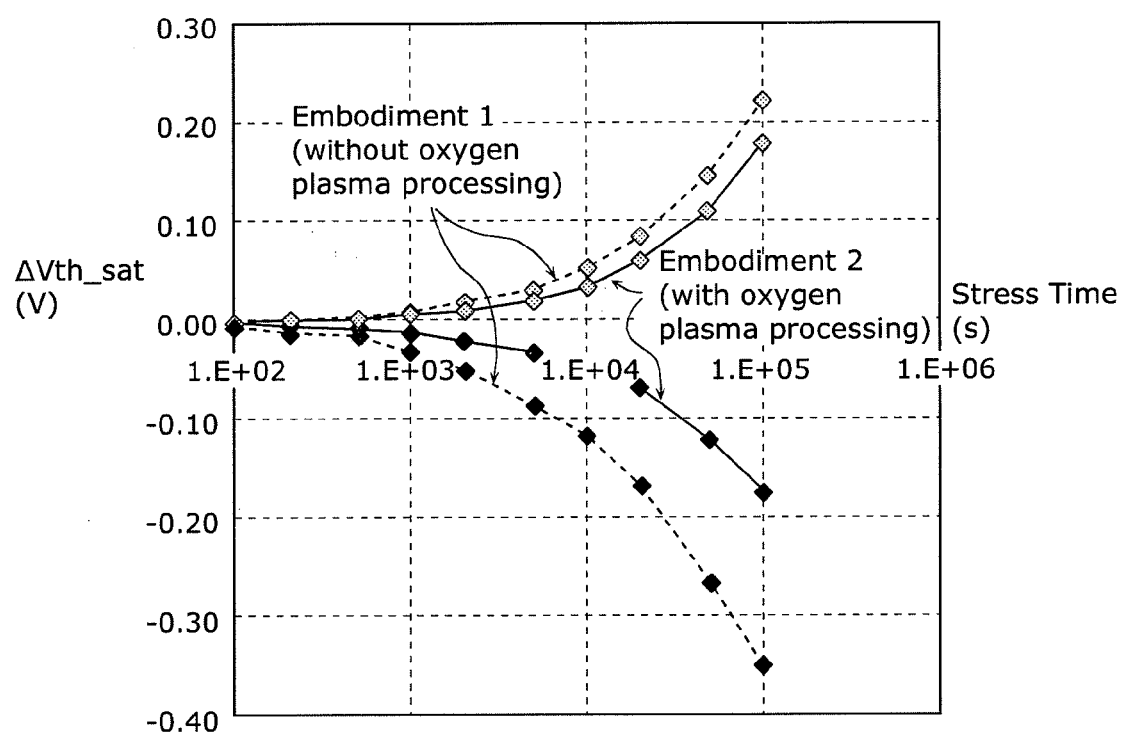
FIG. 14 is a graph plotting a shift amount of a threshold voltage when the thin-film semiconductor device 10 for display apparatus according to Embodiment 1 and the thin-film semiconductor device 10A for display apparatus according to Embodiment 2 are stressed.

Each of FIGS. 12A and 13A is a view for explaining the effects of the thin-film semiconductor device 10 for display apparatus according to Embodiment 1. Each of FIGS. 12B and 13B is a view for explaining the effects of the thin-film semiconductor device 10A for display apparatus according to Embodiment 2. FIG. 14 is a graph plotting a shift amount of a threshold voltage when the thin-film semiconductor device 10 for display apparatus according to Embodiment 1 and the thin-film semiconductor device 10A for display apparatus according to Embodiment 2 are stressed.

As illustrated in FIG. 12A, in the thin-film semiconductor device 10 for display apparatus according to Embodiment 1, fixed charges occur in the channel protection layer 5 comprising organic material. Therefore, as illustrated in FIG. 13A, electrons moving from the source electrode 8s to the drain electrode 8d are often trapped by the organic components in the channel protection layer 5.

On the other hand, in the thin-film semiconductor device 10A for display apparatus according to Embodiment 2, the oxygen plasma processing dissolves the organic material in the channel protection layer 5 so that oxygen atoms are inserted into the frameworks of the molecules in the channel protection layer 5. As a result, the channel protection layer 5 becomes a film having frameworks and compositions which are similar to those of a silicon oxide film. Therefore, as illustrated in FIGS. 12B and 13B, it is possible to reduce a possibility that the electrons moving from the source electrode 8s to the drain electrode 8d are trapped by the organic components in the channel protection layer 5. It is therefore suppress a shift amount of a threshold voltage to improve a reliability as a device.

FIG. 14 plots results of measuring current-voltage characteristics when the thin-film semiconductor device 10 for display apparatus according to Embodiment 1 and the thin-film semiconductor device 10A for display apparatus according to Embodiment 2 are stressed to flow a current. Note that the measurement is performed by stressing the target devices at a threshold voltage Vth, a gate voltage Vgs=Vth+20 V, and a drain voltage Vds=5 V. Likewise, different measurement is performed by stressing the target devices at a gate voltage Vgs=Vth−20 V and a drain voltage Vds=5 V. In FIG. 14, a broken-line curve indicates a result of measuring the thin-film semiconductor device 10 for display apparatus according to Embodiment 1 (Embodiment 1) on which the oxygen plasma processing has not been performed, while a solid-line curve indicates a result of measuring the thin-film semiconductor device 10A for display apparatus according to Embodiment 2 (Embodiment 2) on which the oxygen plasma processing has been performed. Furthermore, the curve by which the threshold voltage is shifted to have a positive value indicates the case where Vds=Vth+20 V (Vds=5 V) in stressing, while the curve by which the threshold voltage is shifted to have a negative value indicates the case where Vgs=Vth−20 V (Vds=5 V) in stressing, As seen in FIG. 14, the thin-film semiconductor device 10A for display apparatus according to Embodiment 2 (Embodiment 2) on which the oxygen plasma processing has been performed has a higher reliability as a device and a larger shift amount of the threshold voltage, in comparison to the thin-film semiconductor device 10 for display apparatus according to Embodiment 1 (Embodiment 1).

In addition, the oxygen plasma processing on the channel protection layer 5 as described in the present embodiment can further improve turn-OFF characteristics in comparison to the Embodiment 1. This will be explained with reference to FIG. 15.

Figure 15:
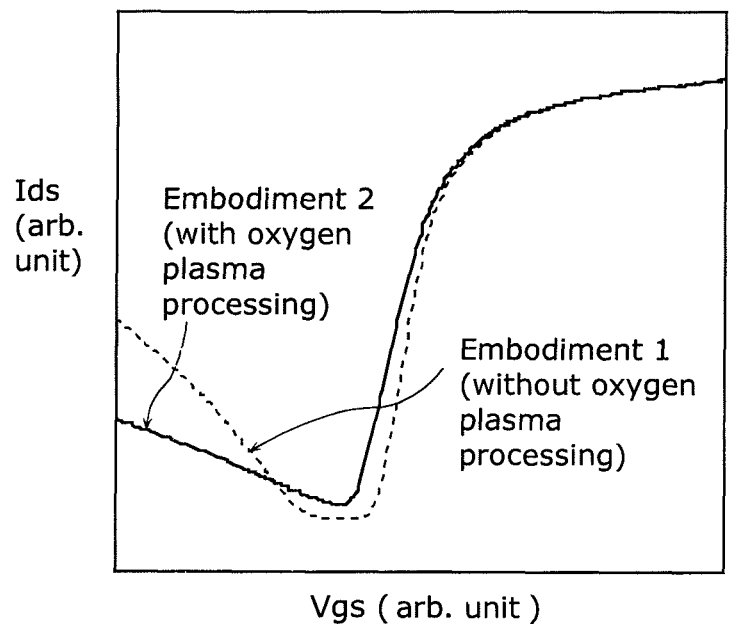
FIG. 15 is a graph plotting current-voltage characteristics of the thin-film semiconductor devices 10 and 10A for display apparatus according to Embodiments 1 and 2, respectively.

FIG. 15 is a graph plotting current-voltage characteristics of the thin-film semiconductor devices 10 and 10A according to Embodiments 1 and 2, respectively. In FIG. 15, the broken-line curve indicates a result of measuring the Embodiment 1 on which the oxygen plasma processing has not been performed, while the solid-line curve indicates a result of measuring Embodiment 2 on which the oxygen plasma processing has been performed.

As seen in FIG. 15, Embodiment 2 with the oxygen plasma processing can reduce an OFF-current and improve turn-OFF characteristics more than Embodiment 1 without oxygen plasma processing does. It is considered that this is because the oxygen plasma processing reduces the fixed charges in the channel protection layer 5 to suppress back channel conduction.

Thus, in Embodiment 2, the oxygen plasma processing is performed on the channel protection layer 5. The oxygen plasma processing is performed desirably at an RF power concentration range from 3 $W/cm^2$ to 30 $W/cm^2$, a temperature range from 50° C. to 350° C., and a pressure range from 1 Torr to 10 Torr.

More specifically, the lower limit of the RF power concentration is 3 $W/cm^2$ in consideration of entry depth of oxygen into the channel protection layer 5, while the upper limit of the RF power concentration is 30 $W/cm^2$ in consideration of damages to the channel protection layer 5 and the channel layer 4. It is further desirable that the lower limit of the temperature is 50° C. in consideration of displacement efficiency of oxygen to the organic material in the channel protection layer 5, while the upper limit of the temperature is 350° C. in order to prevent dehydrogenating from the channel layer 4. It is also desirable that the lower limit of the pressure is 1 Torr in consideration of damages to the channel protection layer 5 and the channel layer 4, while upper limit of the pressure is desirably 10 Torr in consideration of displacement efficiency of oxygen to the organic material in the channel protection layer 5. Note that in the present embodiment, an oxygen flow rate is 1500 sccm (standard cc/min), a power concentration is 1 $W/ccm^2$, a pressure is 1 Torr, a plasma irradiation duration is 10 sec, and a temperature is 120° C.

In general, the oxygen plasma processing is used, for example, to ash an organic resist. In this case, organic components in the organic resist are dissolved to remove the organic resist. On the other hand, in the present embodiment, the channel protection layer 5 includes silicon. Therefore, after ashing the channel protection layer 5, silicon remains even after the organic components in the channel protection layer 5 are dissolved. Therefore, if the channel protection layer 5 coated by the organic material is ashed under the above-described conditions, the organic components in the channel protection layer 5 are dissolved to form the channel protection layer 5 to be similar to a silicon oxide film.

(Embodiment 3)

Figure 16A:
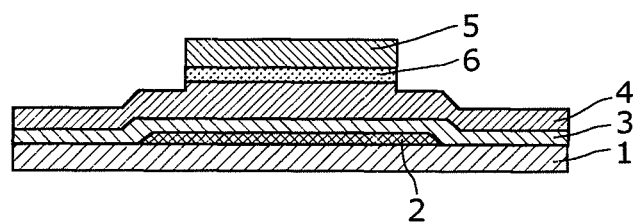
FIG. 16A is a cross-sectional view schematically illustrating a step of etching in a method of manufacturing a thin-film semiconductor device 10B for display apparatus according to Embodiment 3.
Figure 16B:
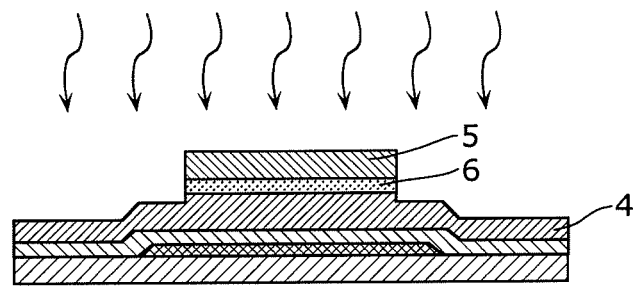
FIG. 16B is a cross-sectional view schematically illustrating a step of baking (second baking) in the method of manufacturing the thin-film semiconductor device 10B for display apparatus according to Embodiment 3.
Figure 16C:
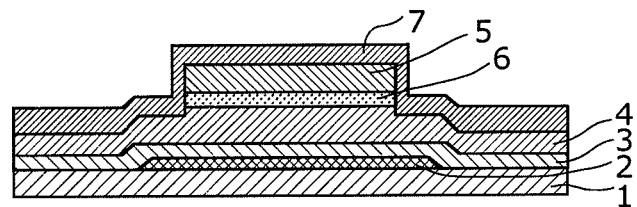
FIG. 16C is a cross-sectional view schematically illustrating a step of forming a contact layer in the method of manufacturing the thin-film semiconductor device 10B for display apparatus according to Embodiment 3.
Figure 16D:
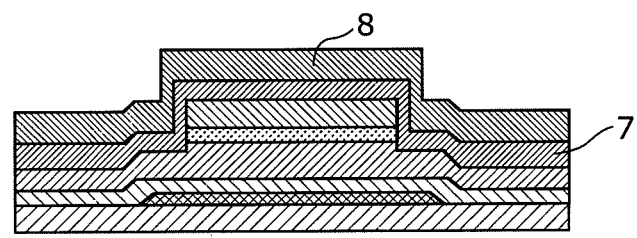
FIG. 16D is a cross-sectional view schematically illustrating a step of forming a source drain metal film in the method of manufacturing the thin-film semiconductor device 10B for display apparatus according to Embodiment 3.
Figure 16E:
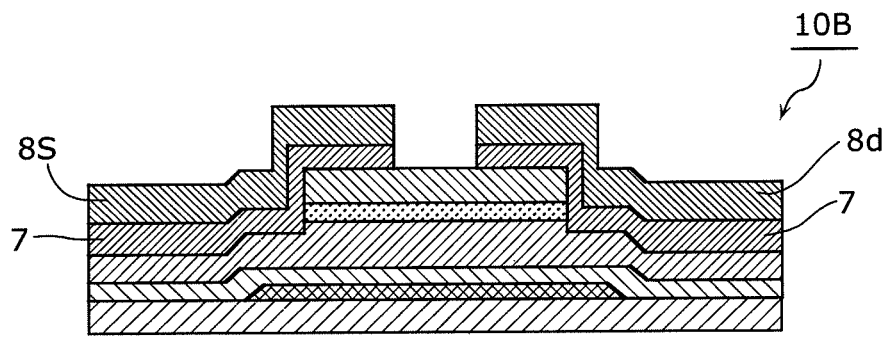
FIG. 16E is a cross-sectional view schematically illustrating a step of patterning on the contact layer and patterning the source electrode and the drain electrode in the method of manufacturing the thin-film semiconductor device 10B for display apparatus according to Embodiment 3.

Next, the description is given for a thin-film semiconductor device 10B for display apparatus according to Embodiment 3 with reference to FIGS. 16A and 16E. FIGS. 16A to 16E are cross-sectional views of a part of the steps in the method of manufacturing the thin-film semiconductor device 10B for display apparatus according to Embodiment 3.

The structure of the thin-film semiconductor device 10B for display apparatus according to Embodiment 3 is the same as the structure of the thin-film semiconductor device 10 for display apparatus according to Embodiment 1 illustrated in FIG. 1.

Embodiment 3 differs from Embodiment 1 in the manufacturing method. The method of manufacturing the thin-film semiconductor device 10B for display apparatus according to the present embodiment includes a step of further baking (the second baking) the post-baked channel protection layer 5, at a certain stage between the step of forming the interface layer (FIG. 2F) and the step of forming the source electrode and the drain electrode (FIG. 2K) in the method of manufacturing the thin-film semiconductor device 10 for display apparatus according to Embodiment 1.

The following describes the method of manufacturing the thin-film semiconductor device 10B for display apparatus according to Embodiment 3 with reference to FIGS. 16A to 16E and with reference to the method of manufacturing the thin-film semiconductor device 10 for display apparatus according to Embodiment 1 illustrated in FIGS. 2A to 2K.

First, in the same manner as described for the thin-film semiconductor device 10 for display apparatus according to Embodiment 1, the step of preparing the substrate (2A), the step of forming the gate electrode (FIG. 2B), the step of forming the gate insulation film (FIG. 2C), and the step of forming the channel layer (FIG. 2D), the step of coating the channel protection layer (FIG. 2E), the step of pre-baking the channel protection layer (FIG. 2F), the step of lithographic exposure and development on the channel-protection layer (FIG. 2G), and the step of post-baking the channel protection layer (FIG. 2H) are performed sequentially.

Next, as illustrated in FIG. 16A, in the same manner as described with reference to FIG. 2I, predetermined etching is performed. As a result, the residues of the channel protection layer 5 and the unnecessary parts of the interface layer 6 which are under the residues are removed to cause the channel protection layer 5 to have a predetermined shape and cause the channel layer 4 to have the raised part and the flat parts.

Next, as illustrated in FIG. 16B, the channel protection layer 5 is baked (second baking) at a temperature of 320° C., for example. Next, as illustrated in FIG. 16C, in the same manner as described with reference to FIG. 2J, the contact layer 7 is formed to cover the top surface of the channel protection layer 5 and the flat parts of the channel layer 4.

Next, as illustrated in FIG. 16D, in the same manner as described with reference to FIG. 2K, the source drain metal film 8 to be the source electrode 8s and the drain electrode 8d is formed to cover the contact layer 7.

Next, as illustrated in FIG. 16E, in the same manner as described with reference to FIG. 2L, the source drain metal film 8 is patterned to form the source electrode 8s and the drain electrode 8d to have a predetermined shape, and then form a pair of the contact layers 7 having a predetermined shape and the channel layer 4 having an island shape.

As a result, the thin-film semiconductor device 10B for display apparatus according to Embodiment 3 can be manufactured.

Thus, like the thin-film semiconductor device 10B for display apparatus according to Embodiment 3, if the channel protection layer 5 etched after post-baking is further baked (second baking), the organic components in the channel protection layer 5 are dissolved to increase silicon-oxygen bonds in molecules in the channel protection layer. As a result, in the same manner as described in Embodiment 2, the channel protection layer 5 in the present embodiment becomes a film having frameworks and compositions which are similar to those of a silicon oxide film. It is therefore possible to reduce a possibility that electrons moving from the source electrode 8s to the drain electrode 8d are trapped by the organic components in the channel protection layer 5 to suppress a shift of a threshold voltage to improve a reliability as a device.

In addition, the second baking can dissolve the organic components in the channel protection layer 5 to reduce the fixed charges in the channel protection layer 5. As a result, in the same manner as described in Embodiment 2, it is possible to suppress back channel conduction to suppress OFF-current to improve turn-OFF characteristics.

Note that, in Embodiment 3, the second baking is desirably performed at a temperature range from 300° C. to 350° C. This is because the lower limit of the baking temperature is desirably 300° C. in consideration of a boundary allowing the organic components in the channel protection layer 5 to be dissolved to increase silicon-oxygen bonds, and the upper limit of the baking temperature is desirably 350° C. in order to prevent dehydrogenating from the channel layer 4.

Note also that, in the above-described Embodiment 2, the second baking can further improve turn-OFF characteristics and suppress a shift of the threshold voltage.

In this case, the second baking is desirably performed prior to the oxygen plasma processing. If the second baking is performed prior to the oxygen plasma processing, rapid change sometimes occurs in compositions or in a volume of the channel protection layer 5. However, the second baking prior to the oxygen plasma processing can prevent the rapid change in compositions or in a volume of the channel protection layer 5, and can prevent the channel protection layer 5 from being cracked, for example.

(Embodiment 4)

Figure 17:
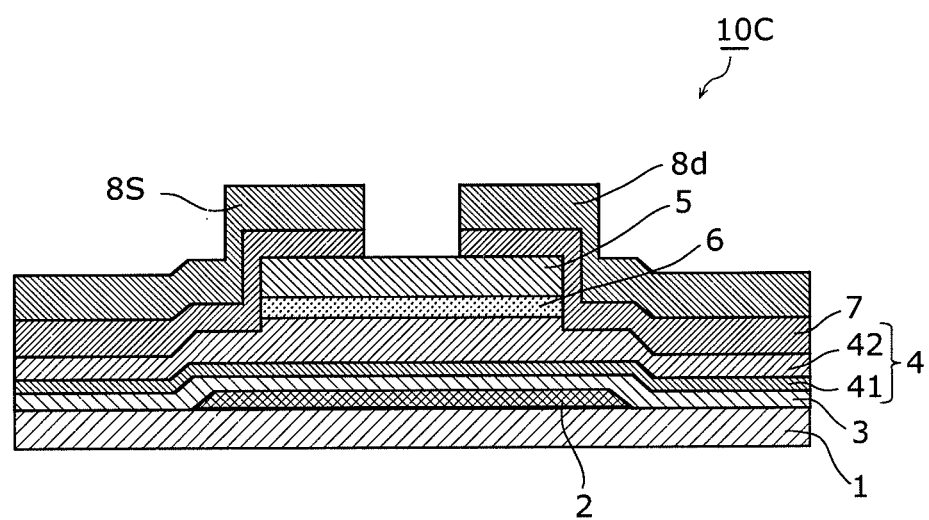
FIG. 17 is a cross-sectional view schematically illustrating a structure of a thin-film semiconductor device 10C for display apparatus according to Embodiment 4.

Next, the description is given for a thin-film semiconductor device 10C for display apparatus according to Embodiment 4 with reference to FIG. 17. FIG. 17 is a cross-sectional view schematically illustrating a structure of a thin-film semiconductor device 10C for display apparatus according to Embodiment 4.

The thin-film semiconductor device 10C for display apparatus according to Embodiment 4 differs from the thin-film semiconductor device 10 for display apparatus according to Embodiment 1 in a structure of the channel layer. More specifically, the thin-film semiconductor device 10C for display apparatus according to Embodiment 4 has a plurality of channel layers. The same reference numerals in FIG. 1 are assigned to the identical structural elements in FIG. 17, so that the identical structural elements will not be described again.

As illustrated in FIG. 17, the channel layer 4 in the thin-film semiconductor device 10C for display apparatus according to Embodiment 4 has a two-layer structure, including a first channel layer 41 and a second channel layer 42.

The first channel layer 41 is provided on the gate insulation film 3 below a raised part of the second channel layer 42. The first channel layer 41 is a polycrystalline semiconductor layer comprising polycrystalline silicon or the like. The first channel layer 41 as the polycrystalline semiconductor layer includes a microcrystalline semiconductor layer having an average grain size of 10 nm to 50 nm.

The second channel layer 42 is provided on the first channel layer 41. The second channel layer 42 corresponds to the channel layer 4 according to Embodiment 1. The second channel layer 42 has a raised shape (raised part) and flat shapes (flat parts) on the surface. The second channel layer 42 is an amorphous semiconductor layer comprising amorphous silicon.

Thus, in the thin-film semiconductor device 10C for display apparatus according to the present embodiment, the channel layer 4 includes the first channel layer 41 (lower layer) that is an amorphous semiconductor layer and the second channel layer 42 (upper layer) that is a polycrystalline semiconductor layer. Therefore, the thin-film semiconductor device 10C for display apparatus according to the present embodiment can improve the turn-On/turn-Off characteristics more than those of Embodiment 1.

Note that the thin-film semiconductor device 10C for display apparatus according to the present embodiment can be manufactured in the same method as described in Embodiment 1, and may be manufactured by the method described in Embodiment 2 or 3.

(Display Device)

Figure 18:
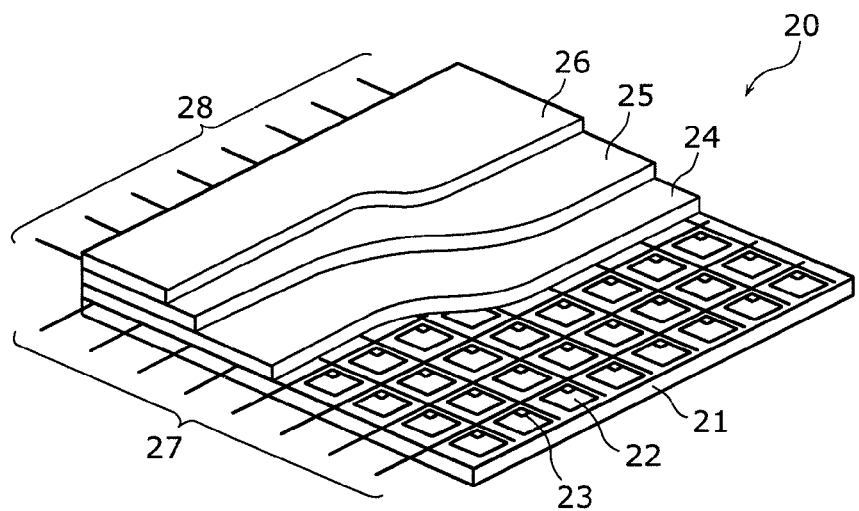
FIG. 18 is a partly-cutaway cross-sectional view of an organic EL display device according to the exemplary embodiment.

The following describes an example of applying each of the thin-film semiconductor devices for display apparatuses according to the above-described embodiments to a display device, with reference to FIG. 18. In the present embodiment, an example of applying the thin-film semiconductor device for display apparatus to an organic EL display device is described.

FIG. 18 is a partly-cutaway cross-sectional view of an organic EL display device according to the present embodiment. The above-described thin-film semiconductor device for display apparatus can be used as a switching transistor or a driving transistor on an active matrix substrate in an organic EL display device.

As illustrated in FIG. 18, the organic EL display device 20 includes: an active matrix substrate 21; pixels 22 arranged in a matrix on the active matrix substrate 21; pixel circuits 23 arranged in an array on the active matrix substrate 21 to be connected to the respective pixels 22; an anode 24, an organic EL layer 25, and a cathode 26 (transparent electrode) which are sequentially stacked on the pixels 22 and the pixel circuits 23; and source lines 27 and gate lines 28 connecting the pixel circuits 23 to a control circuit (not illustrated). The organic EL layer 25 has a multi-layer structure including an electron transport layer, a luminescence layer, a hole transport layer, and the like.

Figure 19:
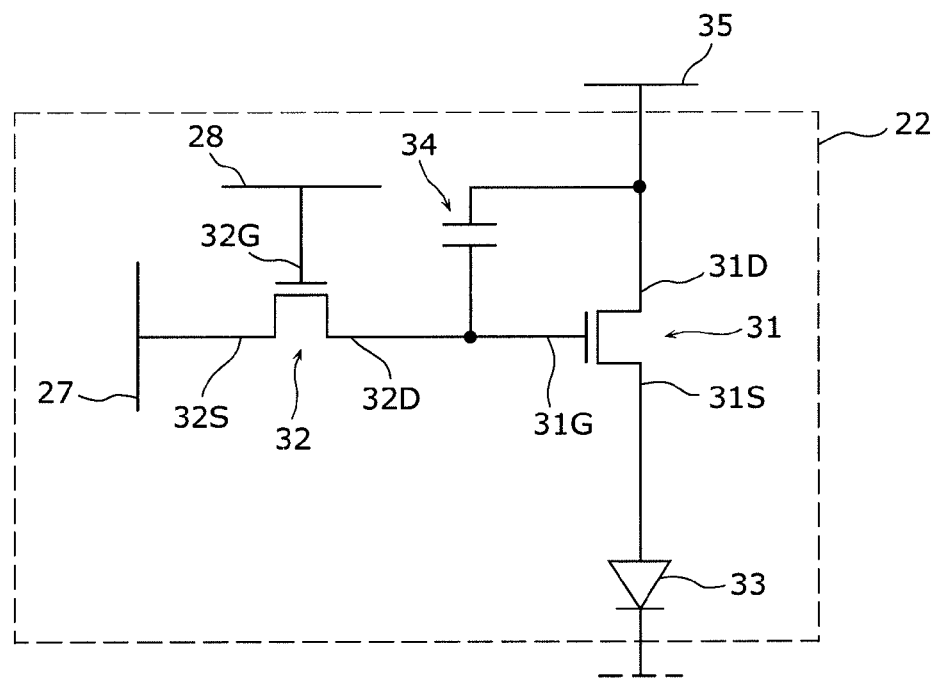
FIG. 19 is a diagram illustrating a circuit structure of a thin-film semiconductor device for display apparatus according to the exemplary embodiment.

Next, a circuit structure of each of the pixels 22 in the above-described organic EL display device 20 is described with reference to FIG. 19. FIG. 19 is a diagram illustrating the circuit structure of the pixel including the thin-film transistor device according to the present embodiment.

As illustrated in FIG. 19, the pixel 22 includes a driving transistor 31, a switching transistor 32, an organic EL element 33, and a capacitor 34. The driving transistor 31 drives the organic EL element 33. The switching transistor 32 selects the pixel 22.

A source electrode 32S of the switching transistor 32 is connected to the source line 27. The gate electrode 32G of the switching transistor 32 is connected to the gate line 28. The drain electrode 32D of the switching transistor 32 is connected to the capacitor 34 and the gate electrode 31G of the driving transistor 31.

The drain electrode 31D of the driving transistor 31 is connected to the power line 35. The source electrode 31S of the driving transistor 31 is connected to the anode of the organic EL element 33.

With this structure, when the gate signal is inputted to the gate line 28 to turn On the switching transistor 32, a signal voltage supplied via the source line 27 is written into the capacitor 34. Then, the hold voltage written to the capacitor 34 is held for one-frame duration. This hold voltage causes analog changes in conductance of the driving transistor 31. Therefore, driving current corresponding to luminescence graduation flows from the anode of the organic EL element 33 to the cathode. As a result, the organic EL element 33 emits light to display a predetermined image.

Note that the display device according to the present embodiment has been described, but the present disclosure is not limited to the embodiment. For example, in the present embodiment, the organic EL display device including organic EL elements has been described, but the present embodiment can be applied also to other display devices using active matrix substrates.

The above-described display device according to the present embodiment can be used as a flat panel display, and can be applied to electronic devices, such as a television set, a personal computer, and a mobile phone, which have various display panels.

Although the thin-film semiconductor device for display apparatus and the method for manufacturing the thin-film semiconductor device for display apparatus according to the present disclosure have been described based on the embodiments, they are not limited to the above-described present embodiment. Those skilled in the art will be readily appreciated that various modifications and combinations of the structural elements and functions in the present embodiment are possible without materially departing from the novel teachings and advantages of the present disclosure. Accordingly, all such modifications and combinations are intended to be included within the scope of the present disclosure.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The thin-film semiconductor device for display apparatus according to the exemplary embodiment disclosed herein is widely applicable in display devices in television sets, personal computers, and mobile phones, and the other various electric devices having a thin-film semiconductor device.

The invention claimed is:

1. A thin-film semiconductor device comprising:
   a substrate;
   a gate electrode above the substrate;
   a gate insulation film above the gate electrode;
   a channel layer above the gate insulation film, the channel layer having a raised part;
   a channel protection layer over the raised part of the channel layer, the channel protection layer comprising an organic material including a surface active agent and a photosensitizing agent, wherein the organic material includes silicon, oxygen, and carbon as a part of the surface active agent and the photosensitizing agent;
   an interface layer at an interface between a top surface of the raised part of the channel layer and the channel protection layer, the interface layer comprising at least carbon and silicon, and the carbon having a higher concentration than a concentration of carbon in the channel protection layer; and
   a source electrode and a drain electrode each of which is provided over (a) a top surface and a side surface of a corresponding one of ends of the channel protection layer, (b) a side surface of the interface layer which continues into the side surface of the channel protection layer, (c) a side surface of the raised part of the channel layer which continues into the side surface of the interface layer, and (d) a top surface of the channel layer which continues into the side surface of the raised part of the channel layer,
   wherein the concentration of the carbon included in the interface layer is at least fifty times as much as a concentration of carbon included as impurity in the channel layer.

2. The thin-film semiconductor device according to claim 1,
   wherein the channel protection layer has a width equal to a width of a top surface of the raised part of the channel layer.

3. The thin-film semiconductor device according to claim 1,
   wherein the organic material comprises sulfur.

4. The thin-film semiconductor device according to claim 3,
   wherein a concentration of sulfur included in the interface layer is at least one hundred times as much as a concentration of sulfur included as impurity in the channel layer.

5. The thin-film semiconductor device according to claim 3,
   wherein the concentration of the sulfur included in the interface layer is at least approximately $5 \times 10^{19}$ atoms/cm$^3$.

6. The thin-film semiconductor device according to claim 1,
   wherein the interface layer has a specific resistance of at least approximately $2 \times 10^6$ ($\Omega \times$cm).

7. The thin-film semiconductor device according to claim 1,
wherein a thickness of the interface layer ranges from approximately 1 nm to approximately 5 nm.

8. The thin-film semiconductor device according to claim 1,
wherein the channel layer includes:
a first channel layer that is a polycrystalline semiconductor layer below the raised part; and
a second channel layer that is an amorphous semiconductor layer on the channel layer, the second channel layer having the raised part.

9. The thin-film semiconductor device according to claim 8,
wherein the polycrystalline semiconductor layer comprises polycrystalline silicon, and
the amorphous semiconductor layer comprises amorphous silicon.

10. The thin-film semiconductor device according to claim 9,
wherein the polycrystalline semiconductor layer includes a microcrystalline semiconductor layer having an average grain size range from approximately 10 nm to approximately 50 nm.

11. The thin-film semiconductor device according to claim 1,
wherein a difference between a thickness of the raised part of the channel layer and a thickness of each of non-raised parts of the channel layer which are located on both sides of the raised part is at least approximately 2 nm.

12. The thin-film semiconductor device according to claim 1,
wherein the concentration of the carbon included in the interface layer is at least approximately $5 \times 10^{20}$ atoms/com$^3$.

* * * * *